United States Patent
Ishida et al.

(10) Patent No.: US 7,790,484 B2
(45) Date of Patent: Sep. 7, 2010

(54) METHOD FOR MANUFACTURING LASER DEVICES

(75) Inventors: Masaya Ishida, Mihara (JP); Atsushi Ogawa, Tenri (JP); Daisuke Hanaoka, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 659 days.

(21) Appl. No.: 11/446,982

(22) Filed: Jun. 6, 2006

(65) Prior Publication Data

US 2006/0281202 A1      Dec. 14, 2006

(30) Foreign Application Priority Data

| Jun. 8, 2005 | (JP) | ............................. | 2005-168188 |
| Jun. 8, 2005 | (JP) | ............................. | 2005-168196 |
| May 1, 2006 | (JP) | ............................. | 2006-127185 |

(51) Int. Cl.
*H01L 21/00* (2006.01)

(52) U.S. Cl. ............................. 438/26; 438/25; 438/55; 438/64; 438/65; 257/E21.499; 257/E21.501; 257/E21.503; 257/E21.509; 257/E21.513

(58) Field of Classification Search ................... 438/25, 438/26, 55, 64, 65
See application file for complete search history.

(56) References Cited

U.S. PATENT DOCUMENTS

| 3,300,339 A | * | 1/1967 | Perri et al. | ................... | 438/760 |
| 3,340,602 A | * | 9/1967 | Hontz | ........................ | 228/206 |
| 3,382,108 A | * | 5/1968 | Wilkins | ....................... | 136/226 |
| 3,383,454 A | * | 5/1968 | Dix | ............................. | 174/556 |
| 3,693,239 A | * | 9/1972 | Dix | ............................. | 228/105 |
| 4,622,433 A | * | 11/1986 | Frampton | ................... | 174/539 |
| 5,468,987 A | * | 11/1995 | Yamazaki et al. | ........... | 257/412 |
| 5,801,073 A | * | 9/1998 | Robbins et al. | ............. | 438/125 |
| 6,261,866 B1 | * | 7/2001 | Marinis et al. | ............. | 438/115 |
| 6,660,548 B2 | * | 12/2003 | Naydenkov et al. | ........... | 438/26 |
| 6,713,318 B2 | * | 3/2004 | Maeda et al. | ............... | 438/108 |
| 7,084,010 B1 | * | 8/2006 | Kennedy et al. | ............. | 438/115 |
| 7,129,163 B2 | * | 10/2006 | Sherrer et al. | .............. | 438/637 |
| 7,238,076 B2 | * | 7/2007 | Yoshida et al. | ................ | 445/23 |
| 2002/0046693 A1 | * | 4/2002 | Kiyoku et al. | ................. | 117/8 |

(Continued)

FOREIGN PATENT DOCUMENTS

JP        2004-014820        1/2004

(Continued)

*Primary Examiner*—Charles D Garber
*Assistant Examiner*—Pape Sene
(74) *Attorney, Agent, or Firm*—Harness, Dickey & Pierce, P.L.C.

(57) ABSTRACT

A method for manufacturing a laser device includes fixing a laser chip to a holder via a metal having a low melting point by melting the metal at a temperature higher than the melting point, heating the holder to which the laser chip is fixed at a heat treatment temperature that is lower than the melting point and, thereafter, sealing the laser chip by covering the holder to which the laser chip is fixed with a cap. The heating step may be performed in an atmosphere in which ozone is generated or an atmosphere in which oxygen plasma is generated. Furthermore, the holder to which the laser chip is fixed is covered with a cap to make a hermetically sealed package in dry air or an inert gas, and then an ultraviolet ray is irradiated into the package while it is heated.

14 Claims, 17 Drawing Sheets

U.S. PATENT DOCUMENTS

| | | | |
|---|---|---|---|
| 2002/0121863 A1* | 9/2002 | Morishita | 315/169.3 |
| 2002/0179952 A1* | 12/2002 | Nakata | 257/303 |
| 2003/0048818 A1* | 3/2003 | Takeuchi et al. | 372/36 |
| 2003/0067950 A1* | 4/2003 | Hanaoka | 372/34 |
| 2003/0091823 A1* | 5/2003 | Presenz et al. | 428/395 |
| 2003/0146105 A1* | 8/2003 | Shiue et al. | 205/626 |
| 2003/0203205 A1* | 10/2003 | Bi et al. | 428/402 |
| 2005/0153478 A1* | 7/2005 | Yoshida et al. | 438/106 |
| 2006/0068516 A1* | 3/2006 | Hanaoka et al. | 438/26 |

FOREIGN PATENT DOCUMENTS

| | | |
|---|---|---|
| JP | 2004-040051 | 2/2004 |
| JP | 2004-273908 | 9/2004 |
| JP | 2006-332178 | 12/2006 |
| TW | 587356 | 5/2004 |
| TW | 227942 (B) | 2/2005 |

* cited by examiner

FIG. 1A
FIG. 1B
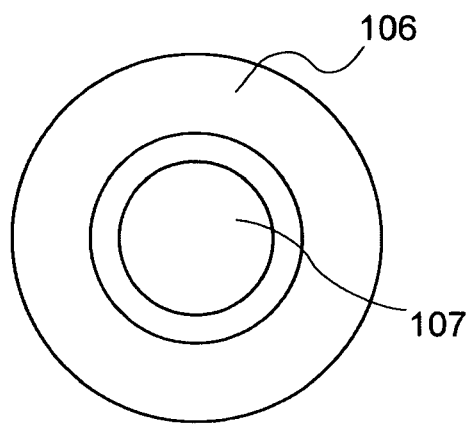
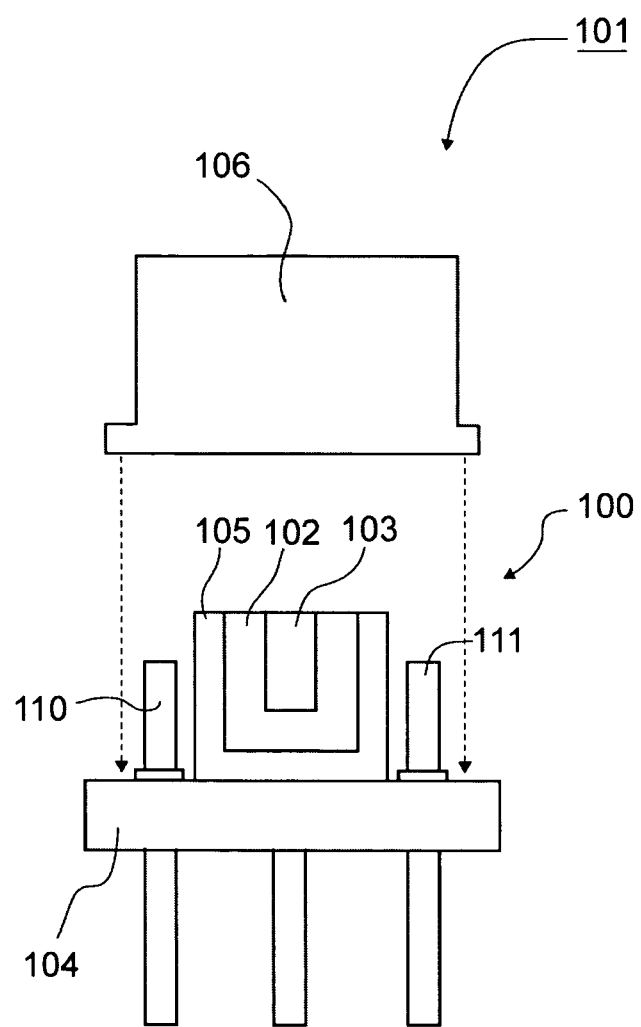

METHOD FOR MANUFACTURING LASER DEVICES

This application claims priority under 35 USC 119(a) based on Japanese Patent Application No. 2005-168188 and No. 2005-168196 filed on Jun. 8, 2005, and Japanese Patent Application No. 2006-127185 filed on May 1, 2006, the entire contents of which are hereby incorporated by reference.

BACKGROUND OF THE INVENTION

1. Field of the Invention

The present invention relates to a method for manufacturing a laser device that is used for a light source of an optical disk drive, a tester, an illuminator, an analyzer or the like. In particular, the present invention relates to a method for manufacturing a shortwave laser device such as a gallium nitride semiconductor laser device that emits a laser beam of blue color, violet color, near-ultraviolet or ultraviolet in a short wavelength range.

2. Description of Related Art

A nitride semiconductor in the group III such as GaN, AlGaN, GaInN and AlGaInN (hereinafter referred to as a "gallium nitride system semiconductor") has a larger energy band gap than an AlGaInAs system semiconductor or an AlGaInP system semiconductor. Therefore, such semiconductor materials can emit light having a short wavelength and are superior in light emission efficiency since they are a direct transition-type. The gallium nitride system semiconductor having these characteristics has been receiving attention as a material that constitutes a semiconductor light emission element such as a semiconductor laser device that is capable of emitting light over a wide wavelength range from ultraviolet to green color or a light emission diode (LED) that can cover a wide light emission wavelength range from ultraviolet to red color. Application areas thereof cover a wide range that includes a high density optical disk drive, a full color display, an environment field and a medical field.

The gallium nitride system semiconductor has a higher thermal conductivity than a GaAs system semiconductor or the like, so it is expected to be used as an element that works for high temperature and high output operation. In addition, while an AlGaAs system semiconductor contains harmful arsenic (As) and a ZnCdSSe system semiconductor contains harmful cadmium (Cd), the gallium nitride system semiconductor does not contain such a harmful material. Furthermore, ammonia ($NH_3$) that is used for manufacturing a gallium nitride system semiconductor has lower toxicity than arsine ($AsH_3$) that is used for manufacturing an AlGaAs system semiconductor, so it is a material that causes little stress on the environment.

A shortwave semiconductor laser device such as a gallium nitride system semiconductor laser device is generally manufactured by sealing a semiconductor laser chip hermetically with a cap that is transparent for a laser beam. In this manufacturing process, a contaminant may intrude into the inside space of the semiconductor laser chip and the cap, and the contaminant may be deposited on a light emitting face of the semiconductor laser chip so that laser characteristics are deteriorated. This is a problem called a degradation of a light emitting end face.

The above-mentioned contaminant is regarded to be a siloxane system material, a hydrocarbon compound or the like. A source of the contaminant is regarded to include a human body, a microorganism, a construction material, grease or oil that is used for a manufacturing machine and atmosphere of the manufacturing process. Furthermore, a pressure sensitive adhesive sheet that is used in the manufacturing process of the laser device can be a source of the contaminant. Once a contaminant adheres to the laser chip or the cap during the production of the laser device, the contaminant inside the cap cannot be removed even if the step of sealing the laser chip inside the cap is performed in a clean room.

For example, it is considered that a contaminant contained in an adhesive agent that is used for the pressure sensitive adhesive sheet is deposited on the light emitting end face in the following steps. In the manufacturing process of the gallium nitride system semiconductor laser chip, a wafer on which a plurality of gallium nitride system semiconductor laser chips are formed is divided into bars having the light emitting end face (hereinafter each of the bars is referred to as a "laser bar"). This laser bar is further divided into individual gallium nitride system semiconductor laser chips in a chip dividing step. In this step, the laser bar is temporarily adhered to the pressure sensitive adhesive sheet. Next, scribing lines are formed on the laser bar by using a diamond scribing tool or the like. Then, the laser bar is divided into chips. In this case, since the laser bar is adhered to the pressure sensitive adhesive sheet, the divided chips of the gallium nitride system semiconductor laser are prevented from falling to pieces.

The divided gallium nitride system semiconductor laser chips are separated from the pressure sensitive adhesive sheet one by one chip. On this occasion, the adhesive agent of the pressure sensitive adhesive sheet may remain on the gallium nitride system semiconductor laser chip. The individual gallium nitride system semiconductor laser chip separated from the pressure sensitive adhesive sheet is fixed to a stem after a chip test is performed. Further, a cap is attached so that the gallium nitride system semiconductor laser chip is sealed hermetically inside a package to be a completed laser device. It is considered that before the hermetical sealing, organic substances may adhere to other elements such as a sub mount, the stem and the cap.

Inside the package of the completed laser device, the adhered contaminant may be vaporized and floating. Then, the vaporized contaminant may cause a photochemical reaction by a photo chemical vapor deposition (CVD) effect due to a shortwave laser beam emitted from the gallium nitride system semiconductor laser chip, so as to generate a photochemical reaction substance containing silicon (Si) or carbon (C) as a main component. This photochemical reaction substance is deposited on the light emitting end face in which light intensity is the highest. In addition, heat due to operation of the laser device causes convection of filler gas, so that photochemical reaction substances contained in the filler gas can be supplied continuously to the light emitting end face of the laser chip.

This phenomenon becomes conspicuous in a laser having an oscillation wavelength (a light emission wavelength) at 550 nm or shorter that has high energy per photon and facilitates to promote chemical reaction, particularly in a laser device that uses a gallium nitride system semiconductor laser chip having an oscillation wavelength at 420 nm or shorter.

When a photochemical reaction substance is deposited on the light emitting end face as described above, it causes increase of light absorption and fluctuation of a reflection factor on the light emitting end face. As a result, drive current of the laser that is necessary for obtaining the same power may increase, and a life of the laser may be shortened substantially.

In order to avoid this problem, there is a technique disclosed in JP-A-2004-14820, which removes a contaminant floating in a filler gas so as to prevent deposition of a reaction substance on the light emitting end face. This technique uses a zeolite adsorbent that is disposed inside the semiconductor laser device that is sealed with a cap. However, according to a result of an experiment performed by the inventor, the contaminant in the filler gas could not removed sufficiently by using this technique. It was found that a reaction substance was deposited on the light emitting end face of the semiconductor laser chip during a long period operation.

As another prior art, JP-A-2004-40051 discloses a method of sealing a stem to which the gallium nitride system semiconductor laser chip is fixed, hermetically with a cap, after removing a contaminant adhered to the gallium nitride system semiconductor laser chip and the cap, by irradiating a ultraviolet ray to the stem, or by irradiating a plasma generated by an electron cyclotron resonance (ECR) method was used. However, according to a result of an experiment performed by the inventor, it was found that the semiconductor laser chip itself was damaged by the energy beam so that degradation such as increase of operating voltage occurred when using this method. In addition, if a component such as the stem or the gallium nitride system semiconductor laser chip is exposed to air after irradiating an ultraviolet ray or plasma, the component may be contaminated again by the contaminant before sealed hermetically. In particular, the re-contamination becomes conspicuous if there is a step that uses an Ag paste containing much organic solvent between a step of irradiating an ultraviolet ray or a plasma and a step of hermetical sealing, or if there is a long period of time for exposing the component to air between the step of irradiating an ultraviolet ray or a plasma and the step of hermetical sealing.

As still another prior art, JP-A-2004-273908 discloses a method of removing a contaminant that is adhered to a gallium nitride system semiconductor laser chip and a cap by sealing a stem to which the gallium nitride system semiconductor laser chip is fixed, hermetically with the cap in an ozone atmosphere, and then irradiating a ultraviolet ray. However, according to a result of an experiment performed by the inventor, it was found that a metal that was used for the semiconductor laser chip except for Au and Pt was oxidized so that degradation such as increase of operating voltage occurred when this method was used. For example, if a solder that fixes the gallium nitride system semiconductor laser chip to the stem or an electrode that is used for the gallium nitride system semiconductor laser chip is oxidized by the ozone, degradation of characteristics or shortening of life may occur. On the other hand, if only the irradiation of the ultraviolet ray is performed simply without the hermetical sealing in the ozone atmosphere, sufficient effect cannot be obtained. It was found that the degradation (increase of drive current) would occur when a continuous operation was performed at an ambient temperature of 60° C. in particular.

SUMMARY OF THE INVENTION

An object of the present invention is to provide a method for manufacturing a laser device having a long life by removing contaminant that adheres to components of a package including a laser chip, a stem and a cap without degrading solder and an electrode that are used for the laser chip and by suppressing deposition of a photochemical reaction substance on a light emitting end face when the laser chip operates.

A method for manufacturing a laser device according to the present invention includes the steps of fixing a laser chip to a holder via a metal having a low melting point by melting the metal at a temperature higher than the melting point, heating the holder to which the laser chip is fixed at a heat treatment temperature that is lower than the melting point, and sealing the laser chip after the heating step by covering the holder to which the laser chip is fixed with a cap.

An assumed contaminant is a siloxane system material that contains silicon or a hydrocarbon compound. In addition, an assumed contamination mechanism is that the contaminant attached to the holder such as a stem or a sub mount or the laser chip is vaporized in the hermetically sealed package and causes a chemical reaction by a laser beam emitted by the laser chip, thereby a reaction substance is deposited on the light emitting end face. In order to prevent the reaction substance from depositing, it may be possible to remove the contaminant before the hermetical sealing. However, it is necessary to prevent reattachment of the contaminant after removing the same. Therefore, it is desirable to perform the removing step in the state where the laser chip is fixed to the holder such as the stem or the sub mount just before the hermetical sealing. However, if a metal having a low melting point is used for fixing the laser chip to the stem, the metal having a low melting point may be melted in the step for removing the contaminant by heating. Therefore, in the manufacturing method according to the present invention, the heat treatment is performed at a temperature that is lower than a melting point of the used metal having a low melting point to be used, so that the contaminant can be removed by heat while the state where the laser chip is fixed to the stem is maintained.

In the manufacturing method according to the present invention, the heat treatment for removing the contaminant can be performed in the state where the laser chip is fixed to the holder such as the stem or the sub mount. Therefore, the hermetical sealing can be performed promptly after removing the contaminant, so that reattachment of the contaminant can be prevented. As a result, deposition of a reaction substance on the light emitting end face can be suppressed, and degradation due to increase of drive current of the laser device can be prevented, so that a laser device having a long life can be realized.

As a preferred embodiment, the heating step is performed in an atmosphere in which ozone is generated. When the contaminant is removed by the heat treatment, a heat treatment temperature must be set to a temperature lower than the melting point of the metal having a low melting point for fixing the laser chip to the holder. Therefore, there is some possibility that the contaminant cannot be removed sufficiently. Combining the heat treatment with an ozone treatment, a high molecular contaminant that cannot be vaporized sufficiently by the heat treatment can be oxidized and decomposed. Thus, the contaminant can be removed effectively.

As another preferred embodiment, the heating step is performed in an atmosphere in which oxygen plasma is generated. When the contaminant is removed by the heat treatment, a heat treatment temperature must be set to a temperature lower than the melting point of the metal having a low melting point for fixing the laser chip to the holder. Therefore, there is some possibility that the contaminant cannot be removed sufficiently. Combining the heat treatment with an oxygen plasma treatment, a high molecular contaminant that cannot be vaporized sufficiently by the heat treatment can be oxidized and decomposed. Thus, the contaminant can be removed effectively.

As still another preferred embodiment, the heating step is performed at the heat treatment temperature that is lower than the melting point by 20° C. or more. This condition enables the heat treatment of the holder in the state where the laser chip is fixed to the holder.

As still another preferred embodiment, the heating step is performed for 10 minutes or longer. This condition enables to remove the contaminant from the holder to which the laser chip is fixed. Furthermore, it is preferable that the heat treatment time be four hours or shorter.

As still another preferred embodiment, the metal having a low melting point is an Au—Sn alloy containing Sn more than or equal to 15% by weight and less than or equal to 90% by weight, and the heating step is performed at the heat treatment temperature of 175° C. or higher. The Au—Sn alloy has a relatively high melting point among metals having a low melting point. Using the Au—Sn alloy, it is possible to realize a heat treatment temperature higher than a boiling point of a typical siloxane system material, so that the contaminant can be removed effectively.

In addition, it is preferable that the heating step that is performed in the atmosphere in which ozone is generated include preventing the laser chip from being irradiated directly with an ultraviolet ray for generating ozone. Thus, it is possible to avoid a damage that can be generated if the laser chip is irradiated directly with the ultraviolet ray, while the contaminant can be removed effectively.

In addition, it is preferable that the heating step be performed in an atmosphere filled with a gas selected from a group consisting of nitrogen, hydrogen, helium and xenon, or with a combination of two or more gases selected from said group. These gases are inert gases and do not cause any damage to the laser chip.

Furthermore, the sealing step includes hermetical sealing of the laser chip after filling a filler gas having a dew point of −10° C. or lower. Thus, the laser chip is protected without being affected by moisture.

Furthermore, the heating step includes heating the holder to which the laser chip is fixed and the cap in an atmosphere having a dew point of −10° C. or lower. Thus, the contaminant can be removed effectively while the laser chip is protected from influence of moisture.

In addition, it is preferable that the sealing step include hermetical sealing of the laser chip after filling a gas selected from a group consisting of dry air, nitrogen, oxygen, hydrogen, argon, helium and xenon, or filling a combination of two or more gases selected from said group. These gases do not affect the laser device badly.

In addition, it is preferable that a time period of 60 minutes or shorter for exposing the holder to which the laser chip is fixed to atmosphere be provided between the heating step and the sealing step. If the time period is 60 minutes or shorter, there is little influence of recontamination due to attachment of a contaminant in the atmosphere.

In addition, it is preferable that the laser chip have a light emission wavelength of 500 nm or shorter. If the light emission wavelength is 500 nm or shorter, chemical reaction of the contaminant may be generated due to the shortwave light. If the light emission wavelength is 450 nm or shorter, the chemical reaction becomes conspicuous. If the light emission wavelength is 420 nm or shorter, the chemical reaction becomes more conspicuous. In this case, a long life of the laser device can be realized by adopting the manufacturing method of the present invention.

In addition, it is preferable that the laser chip be a nitride semiconductor laser chip. A nitride semiconductor laser chip is suitable for a small size and effective generation of shortwave laser.

Another structure of a method for manufacturing a laser device according to the present invention includes the steps of fixing a laser chip inside a package having a light transparent window; sealing inside the package hermetically, and irradiating light having a wavelength of 420 nm or shorter into the package through the light transparent window while heating the laser device at a temperature of 70° C. or higher.

The inside of the package means a space enclosed by the stem to which the laser chip is fixed and the cap that is bonded to the stem, for example. When heating at a temperature of 70° C. or higher, some substances that are considered to be contaminants are vaporized inside the package as described below. Then, the vaporized contaminant are decomposed and removed by irradiation of light having a wavelength of 420 nm or shorter (hereinafter referred to as a "ultraviolet ray or the like"). Thus, a contaminant existing at a portion that is not sufficiently irradiated with the ultraviolet ray or the like is also removed. In addition, the manufacturing method of the present invention provides little possibility of recontamination since the ultraviolet ray or the like is irradiated after the hermetical sealing. Therefore, deposition of the photochemical reaction substance on the light emitting end face is prevented during operation of the laser device, so that increase of light absorption and fluctuation of reflectance can be suppressed. Thus, a laser device having a long life with stable drive current of the laser chip for a long period can be realized.

As a preferred embodiment, the light irradiating step includes heating the laser device at a temperature of 280° C. or lower. Since this heating temperature is lower than a melting point of solder such as AuSn, the ultraviolet ray or the like can be irradiated while keeping the state where the laser chip is fixed to the package.

As another preferred embodiment, a wavelength of the light to be irradiated has a wavelength is 150 nm or longer and 290 nm or shorter. Light having a wavelength of 150 nm or longer can pass the light transparent window, and light having a wavelength of 290 nm or shorter can cut off a siloxane bond of a siloxane system material that is considered to be a contaminant so that the contaminant can be decomposed.

As still another preferred embodiment, the hermetically sealing step includes filling gas consisting of dry air or an inert gas into the package. Thus, a metal of solder or an electrode used inside the package can resist oxidation or corrosion.

As still another preferred embodiment, a dew point of the gas for filling is −10° C. or lower. Thus, a metal of solder or an electrode used inside the package can resist oxidation or corrosion.

As still another preferred embodiment, the light transparent window is made of one or more materials selected from a group consisting of quartz glass, quartz and sapphire, or a material containing said one or more materials as a base material. These materials have good transmittance for an ultraviolet ray, so that ultraviolet ray or the like emitted from outside can reach the inside of the package without being absorbed by the light transparent window.

As still another preferred embodiment, the laser chip has a light emission wavelength of 420 nm or shorter. Light having a wavelength of this range can decompose organic substances. As a result, a photochemical reaction substance may be deposited on the light emitting end face. Therefore, the effect of preventing deposition of a photochemical reaction substance according to the manufacturing method of the present invention becomes effective.

As still another preferred embodiment, the laser chip is a gallium nitride system semiconductor laser chip. The gallium nitride system semiconductor laser chip can be downsized as a light source of blue color, violet color or near ultraviolet light and is superior in efficiency.

BRIEF DESCRIPTION OF THE DRAWINGS

FIG. 1A is a top view showing a schematic structure of a nitride semiconductor laser device according to a first example of the present invention;

FIG. 1B is a side view showing a schematic structure of the nitride semiconductor laser device;

DESCRIPTION OF THE PREFERRED EMBODIMENTS

Hereinafter, as a preferred example of the present invention, a gallium nitride system semiconductor laser device will be described. However, the problem to be solved by the present invention, which is to suppress degradation of characteristics due to deposition of a photochemical reaction substance on a light emitting end face, is common to laser devices having a light emission wavelength of 550 nm or shorter, particularly 420 nm or shorter. Therefore, the present invention can also be applied to other laser devices such as a SHG laser that uses a laser having a wavelength of approximately 810 nm and a second harmonic generation (SHG) element for emitting light having a wavelength of approximately 405 nm, for example. In addition, the present invention can be applied to other laser devices such as a laser device using an organic substance or a laser device using a zinc oxide system semiconductor. In addition, the effect of preventing deposition of a contaminant or a reaction substance on an end face of a laser during operation by removing contaminant can be obtained also in an AlGaAs system infrared semiconductor laser, an AlGaInP system red color semiconductor laser or the like without limiting to a shortwave laser.

In the following description, a "nitride semiconductor" means a semiconductor made up of at least $Al_xGa_yIn_zN$ (where $0 \leq x \leq 1$, $0 \leq y \leq 1$, $0 \leq z \leq 1$, and $x+y+z=1$). In this case, any atom selected from a group consisting of As, P and Sb may substitute for approximately 20% or less of nitrogen atoms of the nitride semiconductor. In addition, it is possible to dope the nitride semiconductor with Si, O, Cl, S, C, Ge, Zn, Cd, Mg or Be.

First Example

Structure of the Nitride Semiconductor Laser Device

Figure 2:
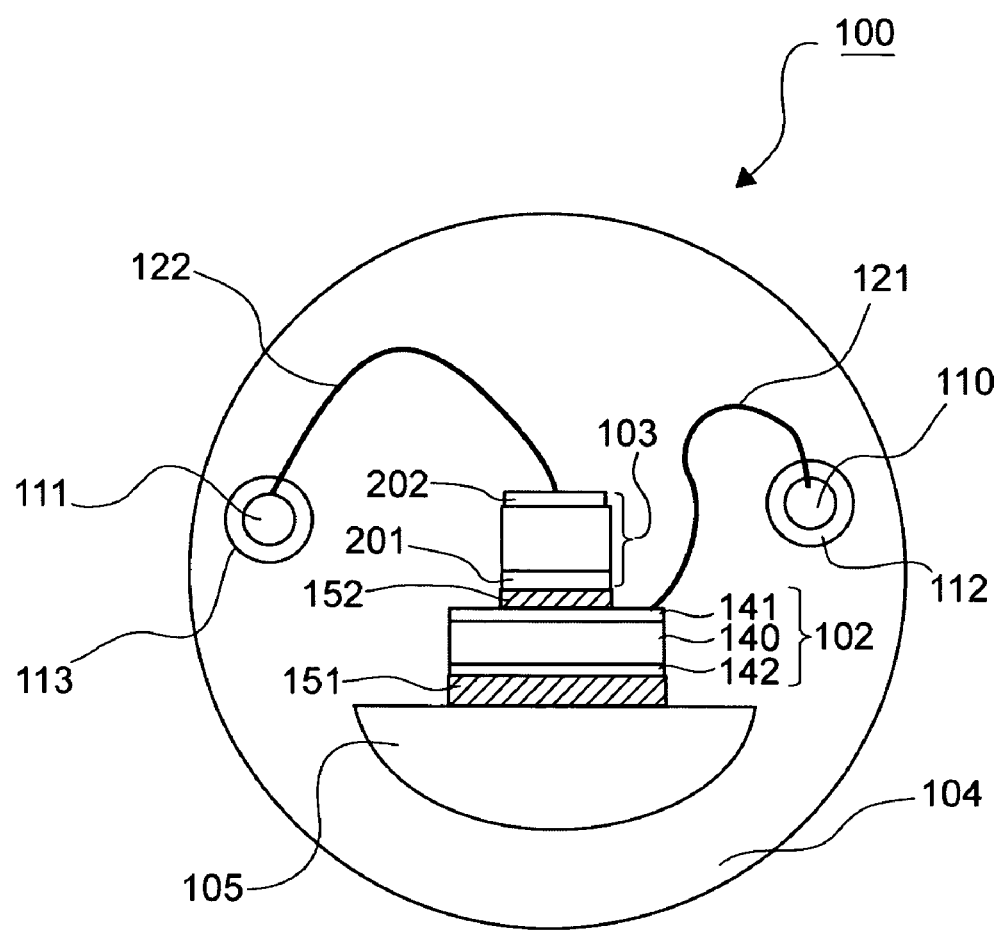
FIG. 2 shows a laser chip fixing holder viewed from a light emitting face side.

FIGS. 1A and 1B are a top view and a side view respectively showing a schematic structure of a nitride semiconductor laser device according to a first example of the present invention. FIG. 2 shows a schematic structure of a laser chip fixing holder that constitutes the nitride semiconductor laser device.

As shown in FIG. 1B, the nitride semiconductor laser device 101 includes a laser chip fixing holder 100 and a cap 106 that covers and seals the laser chip fixing holder 100. The laser chip fixing holder 100 includes a sub mount 102 on which a nitride semiconductor laser chip 103 is mounted and a stem 104 having a block portion 105 to which the sub mount 102 is fixed. The stem 104 and the block portion 105 thereof are molded integrally and made up of a metal such as copper or iron on which Au or the like is plated.

As shown in FIG. 1A, the cap 106 is provided with a light transparent window 107 through which a laser beam is emitted externally from the nitride semiconductor laser chip 103 disposed inside the cap. The light transparent window 107 is made of a transparent material such as quartz, glass, resin or sapphire, through which a laser beam can pass. It is possible to coat a wavelength selective film on the transparent material. The cap 106 is made of a metal such as copper or iron on which Au or the like is plated.

FIG. 2 shows the laser chip fixing holder 100 viewed from a light emitting face side. On the block portion 105 of the stem 104, there are disposed a stem side solder layer 151, the sub mount 102, a chip side solder layer 152 and the nitride semiconductor laser chip 103 in this order.

The sub mount 102 includes an insulative SiC plate 140 and metal films 141 and 142 that are formed on the upper side and the lower sides of the SiC plate 140, respectively. Each of the metal films 141 and 142 includes a titanium (Ti) layer, a platinum (Pt) layer and a gold (Au) layer, for example, formed in this order from the SiC plate 140 side. The sub mount 102 has a role of diffusing heat generated in the nitride semiconductor laser chip 103.

The stem 104 is provided with a pair of pins 110 and 111. Each of the pins 110 and 111 is made of a metal such as copper or iron, and the surface thereof is coated with a thin film of gold (Au) or the like. The stem 104 is insulated from the pins 110 and 111 by insulative rings 112 and 113, respectively, which are made of glass or the like. The pin 110 is connected to an end of a wire 121 made of Au or the like. The other end of this wire 121 is connected to a metal film 141 on the surface of the sub mount 102, which is connected electrically to an n-side electrode 201 of the nitride semiconductor laser chip 103 via a chip side solder layer 152. The pin 111 is connected to an end of a wire 122 made of Au or the like. The other end of this wire 122 is connected to a p-side electrode 202 of the nitride semiconductor laser chip 103.

(Nitride Semiconductor Laser Chip)

Figure 3A:
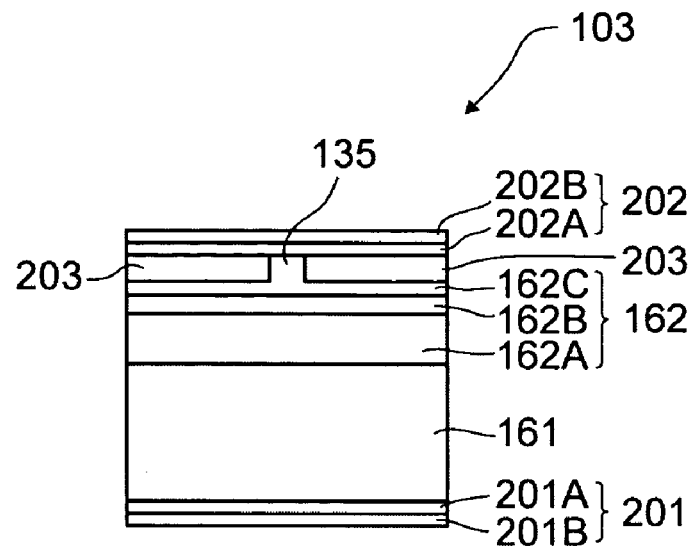
FIG. 3A is a cross sectional view of the nitride semiconductor laser chip according to the first example of the present invention.

FIG. 3A is a cross sectional view of the nitride semiconductor laser chip 103 according to the first example of the present invention. There is provided an n-type GaN substrate 161, on which a nitride semiconductor layer 162 is formed including an n-type clad layer 162A, an InGaN active layer 162B and a p-type clad layer 162C. In addition, on each side of a ridge 135, a part of the p-type clad layer 162C is etched, and a silicon oxide insulator embedding layer 203 is formed there. The p-side electrode 202 is formed on the ridge 135 of the p-type clad layer 162C and on the silicon oxide insulator embedding layer 203 at both sides thereof. The n-side electrode 201 is formed under the n-type GaN substrate 161.

The n-side electrode 201 includes, for example, a lamination layer 201A consisting of Hf and Al and a lamination layer 201B consisting of Mo, Pt and Au from the n-type GaN substrate 161 side. The p-side electrode 202 includes, for example, a lamination layer 202A consisting of Pd and Mo and a lamination layer 202B consisting of Pt and Au from the p-type clad layer 162C side.

Figure 3B:
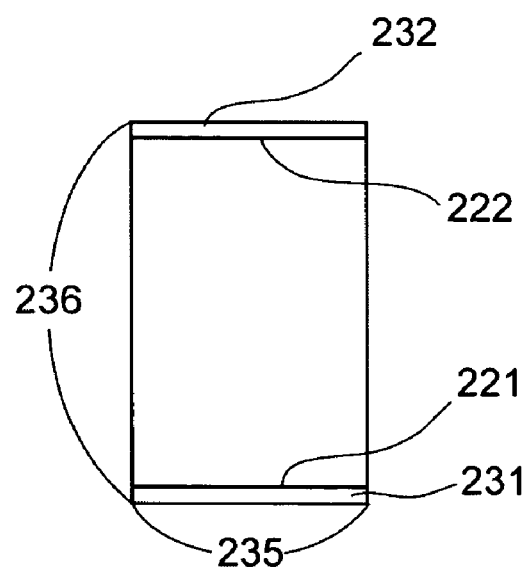
FIG. 3B is a cross sectional view of the nitride semiconductor laser chip.

FIG. 3B is a cross sectional view of the nitride semiconductor laser chip 103. A chip width 235 is 400 µm, and a chip oscillator length 236 is 600 µm. In addition, as shown in FIG. 3B, an anti-reflection (AR) coating 231 consisting of an aluminum oxide layer is formed on a light emitting end face 221 for a laser beam, while a high-reflection (HR) coating 232 is formed on the opposite face 222 of the light emitting end face 221. The HR coating 232 consists of nine layers of silicon oxide layers and titanium oxide layers disposed alternately.

(Manufacturing Process of the Nitride Semiconductor Laser Chip)

A plurality of nitride semiconductor laser chips 103 shown in FIG. 3A are formed on a wafer, which is manufactured as follows. First off, using a well known technique that is used in general, the nitride semiconductor layer 162 and the p-side electrode 202 are formed on the n-type GaN substrate 161. Then, the back side of the n-type GaN substrate 161 is ground or etched so that a thickness of the wafer is decreased to approximately 40-150 µm from the original thickness of 350 µm. After that, the n-side electrode 201 is formed.

In this way, the nitride semiconductor layer 162, the p-side electrode 202 and the n-side electrode 201 are formed on the wafer, and this wafer is cleaved. The AR coating 231 and the HR coating 232 are formed on the cleavage plane by a vacuum evaporation method or an ECR sputtering method. In this case, the cleavage of the wafer is performed so that the oscillator length of the nitride semiconductor laser chip 103 becomes 600 µm. It is possible to form the light emitting end face by etching instead of the cleavage of the wafer.

(Chip Dividing Step of the Nitride Semiconductor Laser Chip)

Figure 4A:
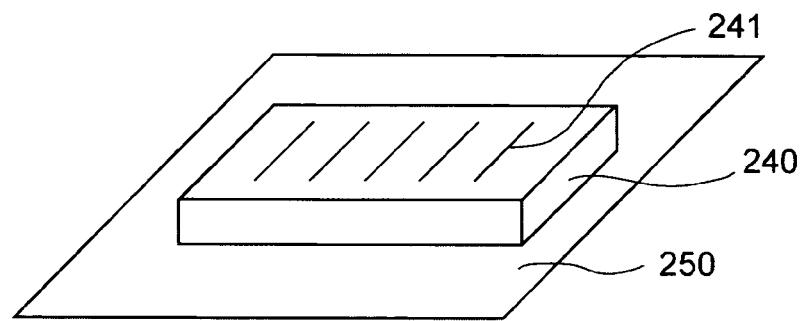
FIG. 4A shows a scribing step that is a first half of a chip dividing step.
Figure 4B:
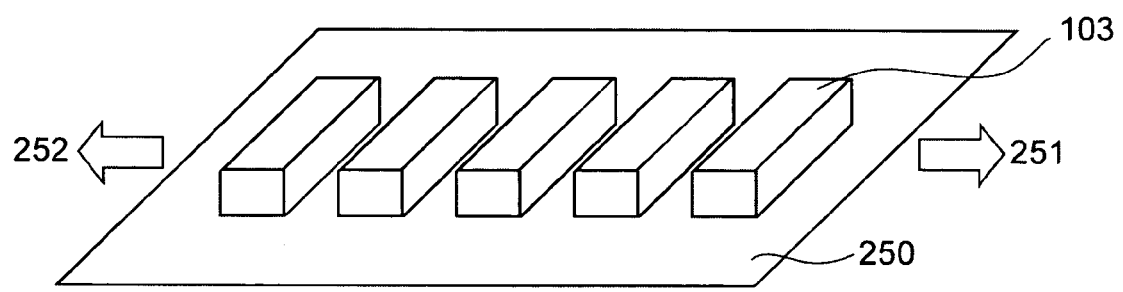
FIG. 4B shows a breaking step that is a second half of the chip dividing step.

In this way, the laser bar is obtained by the cleavage of the wafer, and the laser bar is further divided into nitride semiconductor laser chips 103. FIG. 4A shows a scribing step that is a first half of a chip dividing step, and FIG. 4B shows a breaking step that is a second half of the chip dividing step.

As shown in FIG. 4A, a laser bar 240 that is adhered to a pressure sensitive adhesive sheet 250 is set to a scribing device (not shown), and scribing lines 241 are formed on the laser bar 240 by a diamond scribing tool or the like of the cutting device. An adhesive agent component of the pressure sensitive adhesive sheet 250 may stick to the divided nitride semiconductor laser chip 103 and remains on the same. Next, as shown in FIG. 4B, the pressure sensitive adhesive sheet 250 is expanded in the direction shown by arrows 251 and 252 that are perpendicular to the scribing lines 241, so that the laser bar 240 is divided into individual nitride semiconductor laser chips 103. Since the nitride semiconductor laser chips 103 are adhered to the pressure sensitive adhesive sheet 250, they are prevented from falling to pieces. It is possible to use a dicing method, a laser abrasion method or the like for the chip dividing step instead of using the diamond scribing tool.

The nitride semiconductor laser chip 103 obtained by the above-mentioned steps is tested by a characteristics evaluation test in which the chip is driven by pulse current. If a threshold current value thereof is smaller than a predetermined value, the chip is selected as a good chip.

(Simultaneous Die Bonding and Wire Bonding)

Figure 5:
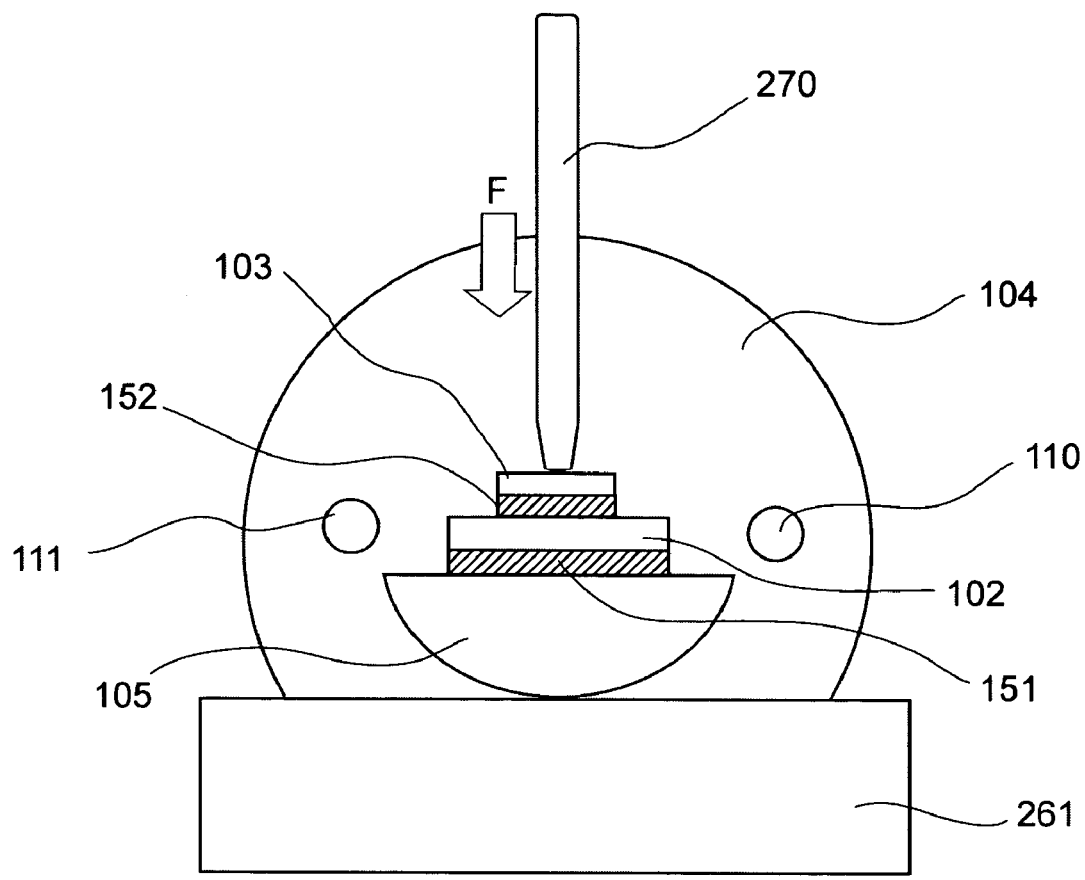
FIG. 5 is an explanatory diagram showing a die bonding step.

Next, the nitride semiconductor laser chip 103 is packaged to make the nitride semiconductor laser device 101. This manufacturing process is as follows. FIG. 5 is an explanatory diagram showing a die bonding step. As shown in FIG. 5, the stem 104 is set on a support table 261 of a die bonding device. The sub mount 102 having the stem side solder layer 151 and the chip side solder layer 152 on each side is disposed on the block portion 105 of the stem. Next, the nitride semiconductor laser chip 103 is sucked by a collet 270 of the die bonding device and moved to a position above the chip side solder layer 152. Then, the nitride semiconductor laser chip 103 is placed on the chip side solder layer 152 and the suction is stopped. The stem side solder layer 151 and the chip side solder layer 152 contact both sides of the sub mount 102. Each of the stem side solder layer 151 and the chip side solder layer 152 contains Au and Sn at a ratio of 80% to 20% (a weight percentage ratio) and has a melting point of 280° C. In this state, the collet 270 of the die bonding device presses the nitride semiconductor laser chip 103 by a load F, while heating at 310° C. for 5 seconds. Then, the stem side solder layer 151 and the chip side solder layer 152 are melted. After cooling at room temperature, the stem side solder layer 151 and the chip side solder layer 152 are hardened so that the simultaneous die bonding is performed (in other words, the nitride semiconductor laser chip 103, the sub mount 102 and the stem 104 are fixed together at the same time).

Next, the stem 104 and the like are moved to a wire bonding device (not shown). As shown in FIG. 2, the wire 122 is connected between the p-side electrode 202 and the pin 111 (wire bonding), and the wire 121 connected between the metal film 141 on the surface of the sub mount 102 and the pin 110 so as to make the laser chip fixing holder 100.

It is possible to use an Au—Sn solder consisting of Au at 10% by weight and Sn at 90% by weight (the solder having a melting point of 217° C.) for the stem side solder layer 151 and the chip side solder layer 152, for example. If a percentage composition of Sn is 15% by weight or more, a practical melting point is obtained. Therefore, it is preferable that a percentage composition of Sn be more than or equal to 15% by weight and less than or equal to 90% by weight. In particular, the percentage composition is preferably within the range of 15-30% by weight and 80-90% by weight that are eutectic points of Au and Sn, and within the range of 30-40% by weight that enables high melting point.

(Heat Treatment and Hermetical Sealing Step)

In the manufacturing method according to the first example, the following steps are performed subsequently with respect to the above-mentioned laser chip fixing holder 100.

Figure 6:
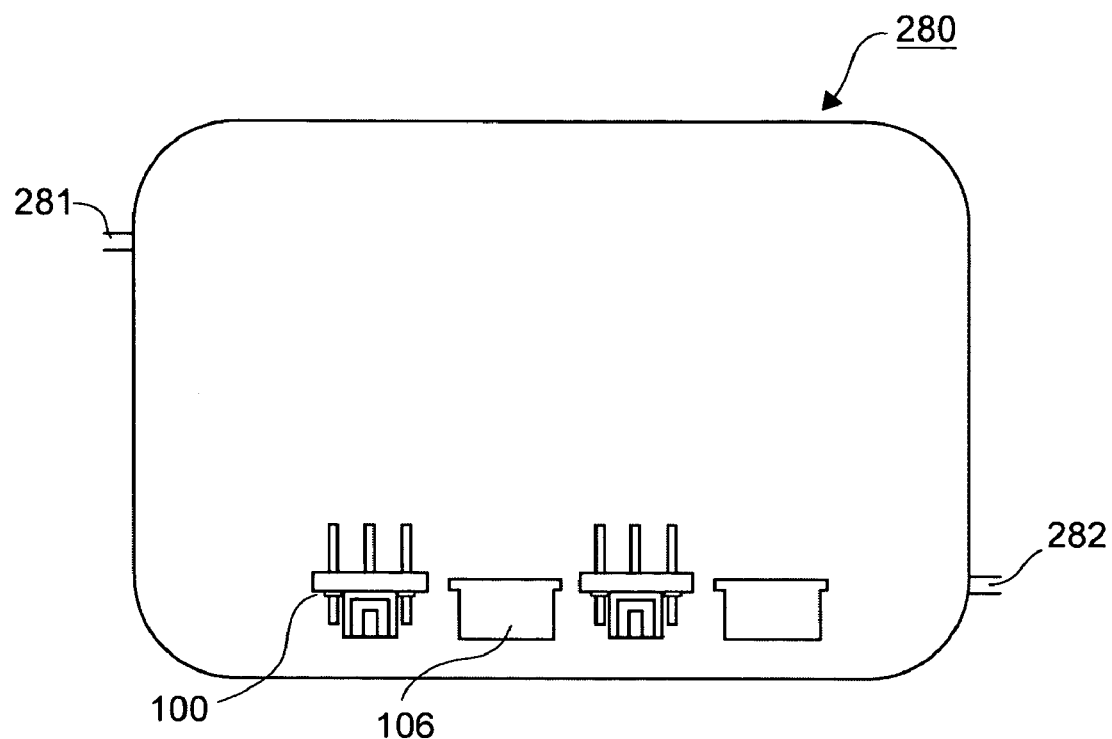
FIG. 6 shows a structure of an oven that is used for a step of a heat treatment and hermetical sealing.

The laser chip fixing holder 100 and the cap 106 are put in an oven 280 according to FIG. 6. Nitrogen gas at atmospheric pressure (having purity of 99.9999% and dew point of −20° C.) is led in through a gas inlet 281 and ejected through a gas outlet 282 gradually. A temperature of the nitrogen gas inside the oven 280 is set to 255° C., so that a temperature for the heat treatment of the laser chip fixing holder 100 and the cap 106 is kept at 255° C. for 30 minutes. The laser chip fixing holder 100 after the heat treatment is taken out of the oven 280, and 10 minutes later it is put in a hermetical sealing device (not shown). The hermetical sealing device is filled with dry air having a dew point of −20° C. In this atmosphere, the cap 106 is put on the laser chip fixing holder 100 so that they are welded to each other by a resistance heating method to be sealed hermetically, and it is taken out of the hermetical sealing device. Thus, dry air is filled, and the nitride semiconductor laser chip 103 inside is shut off from external atmosphere. The resistance heating method utilizes a phenomenon that occurs when current is supplied at contact portions of the cap 106 and the stem 104 for a short time, in which the contact portions are heated and welded to each other. Thus, the nitride semiconductor laser device 101 is completed.

Characteristics of the Semiconductor Laser According to the First Example

A total of 100 nitride semiconductor laser devices was manufactured and tested under the condition of continuous oscillation of 80 mW using an automatic power control (APC) at 70° C. as a life test. As a result, a mean time to failures (MTTF) was found to be 7,852 hours.

In addition, when observing the light emitting end face of each of the 100 nitride semiconductor laser devices after the life test, non of them had degeneration such as a black stain that is regarded as a result of deposition of a reaction substance.

(Ranges of Heating Temperature and Time)

A theoretical upper limit of the heat treatment temperature after the wire bonding step is a melting point of the stem side solder layer 151 and the chip side solder layer 152. However, an alloy in the solder layer is actually softened at a temperature that is close to the melting point, so it is preferable that the upper limit of the heat treatment temperature be set to a temperature lower than the melting point by approximately 20° C. or more. If the solder layers 151 and 152 consist of Au at 80% and Sn at 20%, it is preferable to perform the heat treatment at a temperature of 260° C. or lower since the melting point is 280° C.

Boiling points of typical siloxane system materials that are candidates of the contaminant are as follows. A boiling point of octamethylcyclo tetrasiloxane is 175° C., a boiling point of decamethylcyclo pentasiloxane is 211° C., and a boiling point of dodecamethylcyclo hexasiloxane is 245° C. In addition, boiling points of typical hydrocarbon compounds that are candidates of the contaminant are as follows. A boiling point of decane is 174° C., a boiling point of dodecane is 213° C., a boiling point of tetradecane is 254° C., a boiling point of cyclohexyl acetate is 177° C., a boiling point of 2-ethylhexylacetate is 199° C., and a boiling point of phosphoric ester is 215° C.

The contaminant mentioned above may be contained as an addition agent of an adhesive agent that is used for the pressure sensitive adhesive sheet 250 or may be generated by decomposition of a high molecular organic substance that is a main component of the adhesive agent. Furthermore, a human body, a microorganism, a construction material and oil or grease that is used for a manufacturing device can be a source of the contaminant. When heating these substances to their boiling points, a vaporized contaminant can be removed effectively. Therefore, in order to remove a siloxane system material, for example, it is preferable that the heat treatment temperature be 175° C. or higher. It is more preferable that the heat treatment temperature be 211° C. or higher. It is much more preferable that the heat treatment temperature be 245° C. or higher. If the heat treatment temperature is 175° C. or higher, a hydrocarbon compound such as decane can also be removed effectively. If it is difficult to raise the temperature because a low melting point metal is contained, it is desirable to combine a method that will be described below as a second example or a third example.

In addition, it is preferable to perform the heat treatment for ten minutes or longer time, and it is difficult to obtain a sufficient effect by performing the heat treatment for five minutes or shorter time. Furthermore, the effect is not enhanced even if the heat treatment is performed for more than four hours. Therefore, an appropriate range of a heat treatment time is from 10 minutes to 4 hours.

First Comparison Example

As a first comparison example, the laser chip fixing holder 100 and the cap 106 were moved into the hermetical sealing device filled with dry air without the heat treatment after the simultaneous die bonding and the wire bonding step. Other steps were similar to the steps of the first example.

A total of 100 nitride semiconductor laser device was manufactured in this way and tested under the condition of continuous oscillation of 80 mW using the APC at 70° C. As a result, the MTTF was 756 hours. In addition, when observing the light emitting end face of each of the 100 nitride semiconductor laser devices after the life test, 92 devices (92%) had degeneration such as a black stain that is regarded as a result of deposition of a reaction substance.

From the above-mentioned result, it is confirmed that the heat treatment according to the first example of the present invention can improve reliability of the nitride semiconductor laser device.

Second Comparison Example

As a second comparison example, the laser chip fixing holder 100 and the cap 106 were exposed to air for 90 minutes after the heat treatment, and after that they are moved into the hermetical sealing device filled with dry air, in the manufacturing method according to the first example. Other steps were similar to the steps of the first example.

A total of 100 nitride semiconductor laser device was manufactured in this way and tested under the condition of continuous oscillation of 80 mW using the APC at 70° C. As a result, the MTTF was 1,520 hours. In addition, when observing the light emitting end face of each of the 100 nitride semiconductor laser devices after the life test, 72 devices (72%) had degeneration such as a black stain that is regarded as a result of deposition of a reaction substance.

From the above-mentioned result, it is found that the time period for exposing the laser chip fixing holder 100 to air after the heat treatment is preferably 60 minutes or shorter. The time period for exposing longer than 60 minutes is not considered to be preferable because an amount of moisture that can affect the laser characteristics during operation is absorbed by an insulating layer or sticks to a surface or a peripheral portion of the nitride semiconductor laser chip.

Third Comparison Example

As a third comparison example, the laser chip fixing holder 100 and the cap 106 after the heat treatment were taken out of the oven 280, and ten minutes later they were moved into the hermetical sealing device filled with air having a dew point of 0° C., in the first example. The cap 106 is put on the laser chip fixing holder 100, and they were welded to each other by the resistance heating method to be sealed hermetically. After that, they were taken out of the hermetical sealing device.

A total of 100 nitride semiconductor laser device was manufactured in this way and tested under the condition of continuous oscillation of 80 mW using the APC at 70° C. As a result, the MTTF was 1,859 hours. In addition, when observing the light emitting end face of each of the 100 nitride semiconductor laser devices after the life test, 54 devices (54%) had degeneration such as a black stain that is regarded as a result of deposition of a reaction substance.

From the above-mentioned result, it is found that the dew point of the filler gas filling the sealed space of the nitride semiconductor laser chip is preferably is −10° C. or lower. The dew point that is higher than −10° C. is not considered to be preferable because an amount of moisture that can affect the laser characteristics during operation exists within the cap, and the laser beam may cause a reaction between the moisture and Si or C resulting in degeneration of the light emitting end face.

Second Example

Figure 7:
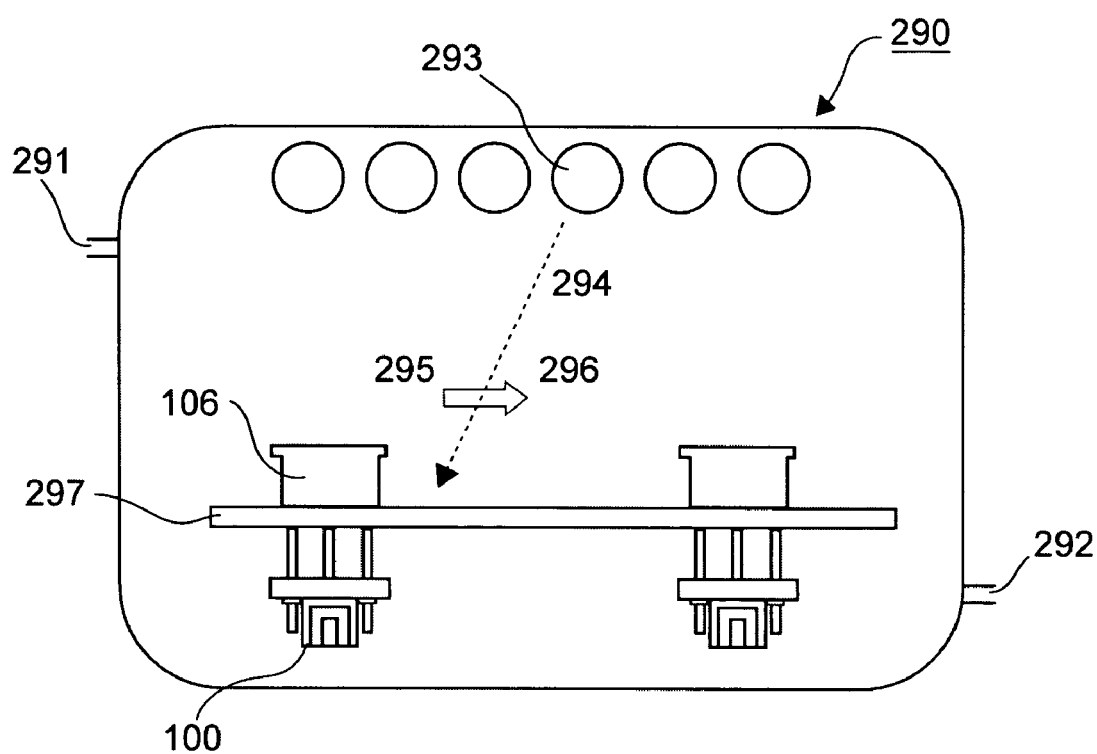
FIG. 7 shows a structure of an ozone generator that is used for a manufacturing method according to a second example of the present invention.

Next, a manufacturing method according to a second example of the present invention will be described mainly about a difference from the manufacturing method of the first example described above. The steps until the simultaneous die bonding and the wire bonding of the nitride semiconductor laser chip 103, the sub mount 102 and the stem 104 are similar to those of the manufacturing method according to the first example. The laser chip fixing holder 100 and the cap 106 after finishing the steps are put in an ozone generator 290 shown in FIG. 7. The ozone generator 290 is filled with almost only oxygen when oxygen at atmospheric pressure 295 (having a purity of 99.9999% and a dew point of −10° C.) is led in through a gas inlet 291 and ejected through a gas outlet 292 gradually. The laser chip fixing holder 100 and the cap 106 are heated to a predetermined temperature of 220° C., and an ultraviolet lamp 293 projects an ultraviolet ray 294 having a wavelength of 185 nm and a wavelength of 254 nm for 30 minutes at an illuminance of 5.1 mW/cm$^2$. Thus, ozone 296 is generated, and an ozone treatment is performed. In this case, the laser chip fixing holder 100 is disposed in such a way that it is not illuminated directly by the ultraviolet ray 294 and shielded by a shielding plate 297 but is exposed to only the ozone.

After the treatment, the laser chip fixing holder 100 is cooled down naturally to a temperature below 50° C. and taken out of the ozone generator 290 to atmosphere. After ten minutes, the cap 106 is put on the laser chip fixing holder 100, and they are welded to each other by the resistance heating method to be sealed hermetically in the hermetical sealing device that is filled with dry air having a dew point of −20° C. Then, they are taken out of the hermetical sealing device. In this way, dry air fills the package, and the nitride semiconductor laser chip 103 inside is shut off from external atmosphere. The resistance heating method utilizes a phenomenon that occurs when current is supplied at contact portions of the cap 106 and the stem 104 for a short time, in which the contact portions are heated and welded to each other.

A total of 100 nitride semiconductor laser device was manufactured in this way and tested under the condition of continuous oscillation of 80 mW using the APC at 70° C. As a result, the MTTF was 8,011 hours. In addition, when observing the light emitting end face of each of the 100 nitride semiconductor laser devices after the life test, none of them had degeneration such as a black stain that is regarded as a result of deposition of a reaction substance.

When the ozone treatment is performed under a heating condition, it is considered that a boiling point of the contaminant is lowered since molecular binding of the high molecular contaminant is cut off to make a low molecular contaminant. Therefore, it is considered that the combination with the ozone treatment promotes removal of the contaminant even in a low temperature so that a longer life is obtained compared with the case where only the heat treatment is simply performed. When the heat treatment temperature is lowered, it is possible to avoid a misregistration of the semiconductor laser chip due to softening of the low melting point metal.

Third Example

Figure 8:
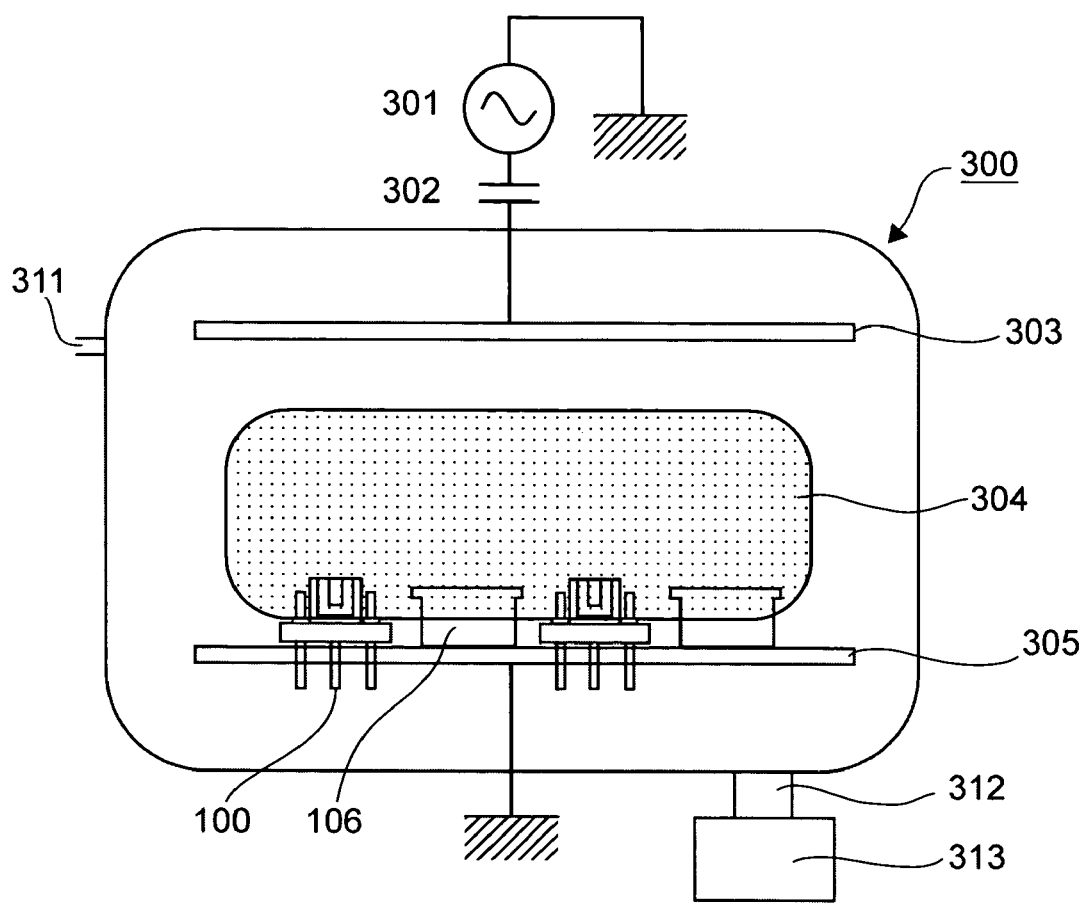
FIG. 8 shows a structure of a plasma generator that is used for a manufacturing method according to a third example of the present invention.

Next, a manufacturing method according to a third example of the present invention will be described mainly about a difference from the manufacturing method of the first example described above. The steps until the simultaneous die bonding and the wire bonding of the nitride semiconductor laser chip 103, the sub mount 102 and the stem 104 are similar to those of the manufacturing method according to the first example. The laser chip fixing holder 100 and the cap 106 after finishing the steps are put in a plasma generator 300 shown in FIG. 8, and argon and oxygen are led in through a gas inlet 311. A flow rate of argon is set to 100 sccm, and a flow rate of oxygen is set to 100 sccm. A vacuum pump 313 that is connected to the gas outlet 312 reduces pressure inside the plasma generator 300 to 10 Pa.

Next, temperature of the laser chip fixing holder 100 and the cap 106 is set to 220° C., and an oxygen plasma treatment is performed for 30 minutes. The oxygen plasma treatment is performed by applying an alternating voltage to an electrode 303 while an electrode 305 is connected to the ground potential. An alternating voltage (having an RF frequency of 13.56 MHz and an RF power of 300 W) generated by a high frequency power supply 301 is applied to the electrode 303 via a coupling capacitor 302, so that plasma 304 is generated between the electrodes 303 and 305. The electrodes 303 and 305 are flat-plate electrodes that are arranged in parallel. Since a potential of the pins 110 and 111 is set to the same potential as the stem 104 during the oxygen plasma treatment, it is possible to avoid a charge up phenomenon in which charge is accumulated in a heterogeneous manner.

After the treatment, the laser chip fixing holder 100 is cooled down naturally to a temperature below 50° C. and taken out to atmosphere. After ten minutes, it is put in a hermetical sealing device (not shown). In the hermetical sealing device that is filled with dry air having a dew point of −20°

C., the cap 106 is put on the laser chip fixing holder 100, and they are welded to each other. Thus, the nitride semiconductor laser chip 103 inside is sealed hermetically. Even if it is taken out of the hermetical sealing device, the inner space of the cap 106 is filled with dry air, and the nitride semiconductor laser chip 103 inside is shut off from the external atmosphere.

A total of 100 nitride semiconductor laser device was manufactured in this way and tested under the condition of continuous oscillation of 80 mW using the APC at 70° C. As a result, the MTTF was 8,151 hours.

When the oxygen plasma treatment is performed under a heating condition, it is considered that a boiling point of the contaminant is lowered since molecular binding of the high molecular contaminant is cut off to make a low molecular contaminant. Therefore, it is considered that the combination with the oxygen plasma treatment promotes removal of the contaminant even in a low temperature so that a longer life is obtained compared with the case where only the heat treatment is simply performed. When the heat treatment temperature is lowered, it is possible to avoid a misregistration of the semiconductor laser chip due to softening of the low melting point metal.

(Variations)

In the first through the third examples described above, the heat treatment, the ozone treatment or the oxygen plasma treatment is performed for the laser chip fixing holder on which the nitride semiconductor laser chip, the sub mount and the stem are mounted simultaneously. However, it is possible to perform the heat treatment, the ozone treatment or the oxygen plasma treatment for the laser chip fixing holder including the nitride semiconductor laser chip mounted directly on the stem without using the sub mount. In addition, it is possible to perform the heat treatment, the ozone treatment or the oxygen plasma treatment for the laser chip fixing holder including the nitride semiconductor laser chip mounted on the sub mount, and then to mount the laser chip fixing holder on the stem.

In the first through the third examples described above, the stem is used as the holder for fixing the laser chip. However, it is possible to use a frame or other package as the holder.

In the first through the third examples described above, the hermetical sealing is performed so as to shut off the laser chip after the heat treatment from outside atmosphere. However, it is possible to perform a plastic sealing by covering with a resin or other sealing for shutting off outside atmosphere.

In the first through the third examples described above, the cap has the light transparent window. However, the light transparent window may be on the holder side, so that the cap works simply for the hermetical sealing.

In the first through the third examples described above, the heat treatment, the ozone treatment or the oxygen plasma treatment is performed for both the laser chip fixing holder and the cap. However, it is sufficient for obtaining the effect to perform the heat treatment, the ozone treatment or the oxygen plasma treatment for at least the laser chip fixing holder.

In the first through the third examples described above, the SiC plate is used as the sub mount 102. However, the sub mount may be made of AlN, diamond, Si, Ag, Fe, CuW, BeO, $Al_2O_3$, GaAs or the like. In addition, the laser chip may be fixed to the stem directly without using the sub mount.

In the first through the third examples described above, Au—Sn solder is used as the stem side solder layer 151 and the chip side solder layer 152. However, it is possible to use other solder such as an In system solder containing InPb, InSn, InAg, InAgPb or the like, or a Sn solder containing Sn, SnPb, SnSb, SnAg, SnSb, SnAgPb, SnPbSb, SnAgCu or the like, or a Pb solder containing PbSn, PbSb, PbAg, PbZn or the like, or a high-temperature solder containing AlZn, SnZn, SnZnBi or the like. Formation of the solder layer can be realized not only by the deposition method but also by a coating method, a sputtering method, a printing method, a plating method and the like. It is also possible to put a sheet of solder on the stem.

In the first through the third examples described above, coating of the light emitting end face 221 and the opposite end face 222 thereof is performed. However, the present invention can also be applied to the case where the coating of the light emitting end face is not performed, and the effect of increasing life is obtained by preventing the reaction substance from depositing on the light emitting end face.

In the first through the third examples described above, the lamination layer 201A of the n-side electrode 201 includes two layers of Hf and Al. However, instead of Hf, an element selected from a group consisting of Ti, Co, Cu, Ag, Ir, Sc, Au, Cr, Mo, La, W, Al, Tl, Y, La, Ce, Pr, Nd, Sm, Eu, Tb, Zr, V, Nb, Ta, Pt, Ni and Pd or a compound thereof can be used. Instead of Al, an element selected from a group consisting of Au, Ni, Ag, Pb, Sb, Zn, Si and Ge or a compound thereof can be used. Furthermore, the thickness of the film is not limited to the above-mentioned example.

In addition, it is possible to dispose a pad portion for wire bonding on the surface of the sub mount to which the laser chip is fixed, or to provide a mark for registration when the die bonding is performed. It is also possible to apply the present invention to a laser device that includes a laser chip having three or more electrodes like a so-called multi beam laser.

Furthermore, it is possible to dispose various known films between the solder layer and the sub mount substrate. For example, it is possible to form a film for improving adhesive properties between the sub mount and the solder layer, a film for preventing a reaction between the sub mount and the solder layer, or a film for improving adhesive properties between them and preventing oxidation, if necessary. It is also possible to dispose various films between two of the solder, the bonding pad and the sub mount for the same purpose.

In the first through the third examples described above, the n-type GaN substrate 161 is used as a substrate of the nitride semiconductor laser chip 103. However, it is possible to use other type of substrate such as p-type GaN, sapphire, SiC, GaAs or the like.

Furthermore, each of the first through the third examples described above has a structure called "junction-up" in which the ridge 135 that becomes a light waveguide portion is arranged at the opposite side of the sub mount. However, the present invention can also be applied to a structure called "junction-down" in which the ridge is arranged at the sub mount side.

Furthermore, in the first through the third examples described above, the laser device includes one laser chip fixed to the stem and has one light emission wavelength. However, the present invention can also be applied to a multi wavelength laser device having two or more light emission wavelengths.

In addition, a semiconductor element other than the nitride semiconductor laser chip 103, for example, a light receiving element or the like may be fixed to the stem 104.

Fourth Example

Structure of the Semiconductor Laser Device

Figure 9A:
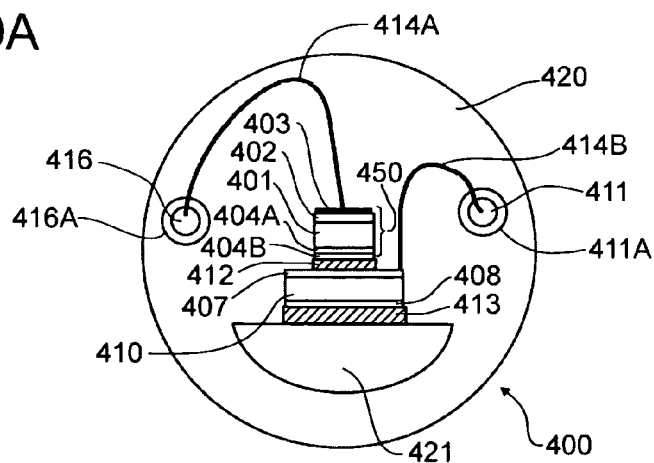
FIG. 9A is a top view of a nitride semiconductor laser device according to a fourth example of the present invention, which shows a state where a cap is removed.
Figure 9B:
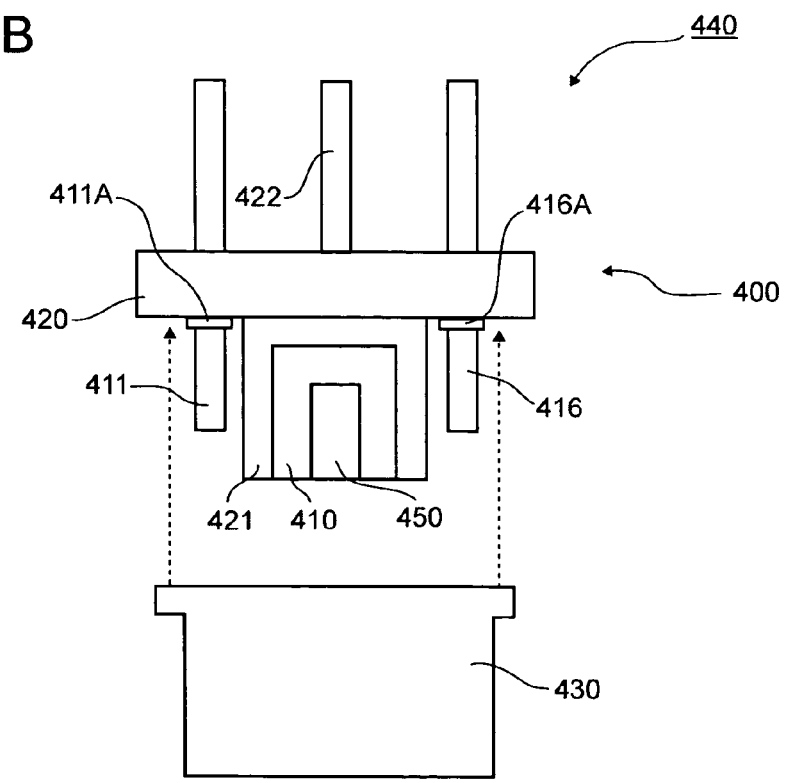
FIG. 9B is a side view of the nitride semiconductor laser device according to the fourth example of the present invention.
Figure 9C:
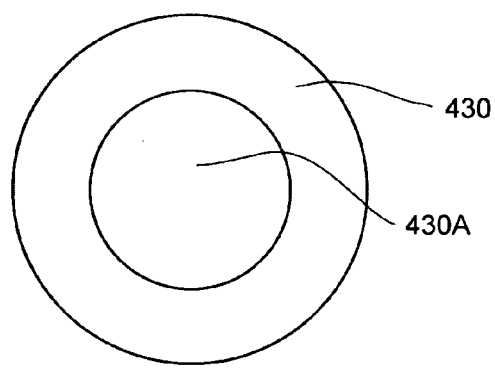
FIG. 9C is a top view showing the cap of the nitride semiconductor laser device according to the fourth example of the present invention.

FIG. 9A is a top view of a nitride semiconductor laser device according to a fourth example of the present invention, which shows a state where a cap is removed, FIG. 9B is a side view of the same nitride semiconductor laser device, and FIG. 9C is a top view showing the cap of the same nitride semiconductor laser device.

A semiconductor laser device 440 includes a laser chip fixing holder 400 and a cap 430, and the both of them are welded to each other so that inside of a package consisting of the stem 420 and the cap 430 is sealed hermetically.

The laser chip fixing holder 400 includes a gallium nitride system semiconductor laser chip 450 that is fixed to a block portion 421 of the stem 420 via a sub mount 410. An end portion of the cap 430 is open, and the other end portion is provided with a light transparent window 430A. The cap 430 is made of a metal such as copper or iron, and the light transparent window 430A is made of quartz, quartz glass, glass, plastic, or sapphire that is transparent for a laser beam emitted from the gallium nitride system semiconductor laser chip 450 and an ultraviolet ray irradiated from an outside.

As shown in FIG. 9A, the gallium nitride system semiconductor laser chip 450 includes an n-type GaN substrate 401, a lamination layer 402 made up of a plurality of gallium nitride system semiconductor layers and the like formed on the n-type GaN substrate 401, a p-side electrode 403 formed on the upper side of the lamination layer 402, and an n-side electrode (an inner layer) 404A and an n-side electrode (an outer layer) 404B formed in this order from the n-type GaN substrate 401 side. The n-side electrode (outer layer) 404B is fixed to the upper side of the sub mount 410 via a solder 412 containing Au at 70% and Sn at 30%.

The sub mount 410 includes an SiC plate and metal multilayer films 407 and 408 formed on the upper and the lower sides of the SiC plate respectively. Each of the metal multilayer films 407 and 408 includes, for example, titanium (Ti), platinum (Pt) and gold (Au) formed in this order from the side that is in contact with the SiC plate of the sub mount 410. The lower side of the sub mount 410 is fixed to the block portion 421 of the stem via a solder (layer) 413 containing SnAg at 3% and Cu at 0.5%. The sub mount 410 has a role of diffusing heat generated in the gallium nitride system semiconductor laser chip 450.

In addition, the p-side electrode 403 is connected electrically to a pin 416 via a wire 414A, and the n-side electrode (the inner layer) 404A is connected electrically to a pin 411 via the n-side electrode (the outer layer) 404B, the solder 412, the metal multilayer film 407 and a wire 414B. Further, insulating rings 411A and 416A are disposed between the stem 420 and the pins 411 and 416, respectively. The stem 420 and the block portion 421 that is a part thereof are insulated electrically from the pins 411 and 416 by the insulating rings 411A and 416A. Through these pins 411 and 416, current is supplied to the gallium nitride system semiconductor laser chip 450. In addition, a pin 422 is connected electrically to the stem 420.

(Structure of the Gallium Nitride System Semiconductor Laser Chip)

Figure 10:
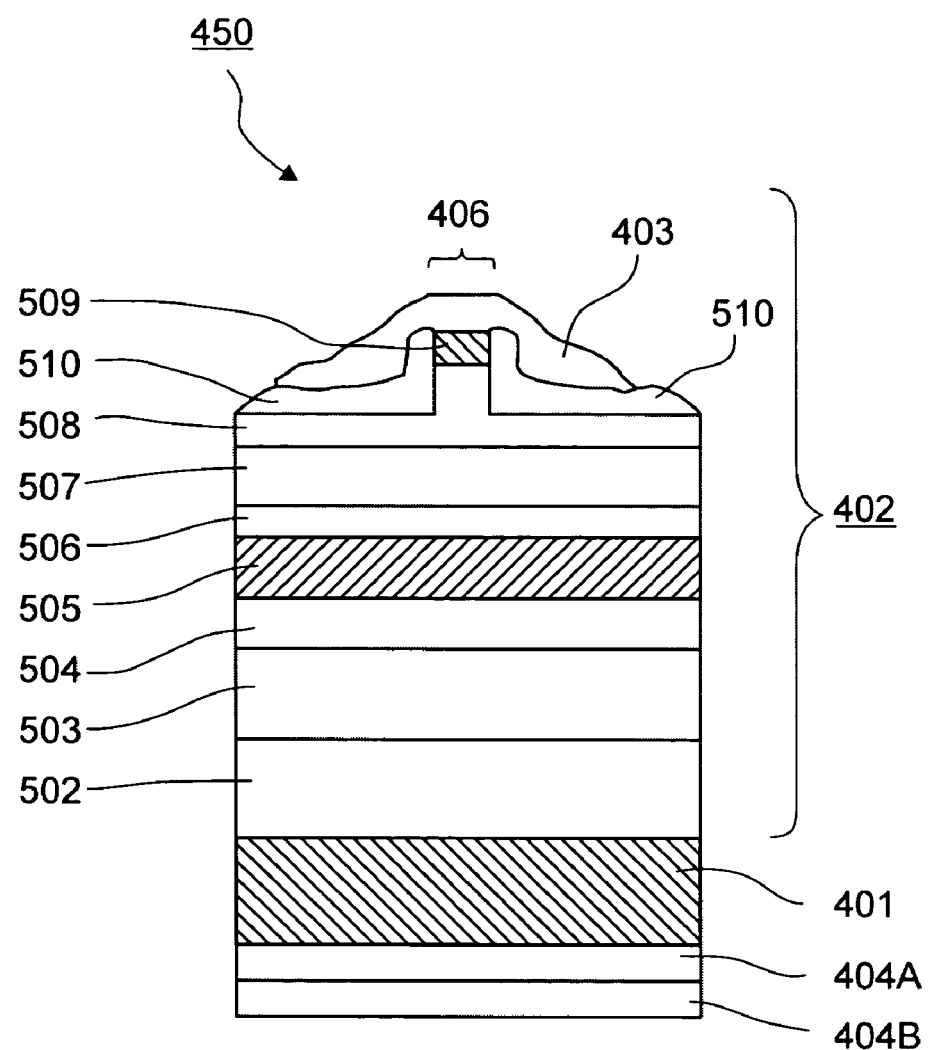
FIG. 10 is a cross sectional view of a gallium nitride system semiconductor laser chip according to the fourth example.

Next, a structure of the gallium nitride system semiconductor laser chip 450 will be described. FIG. 10 is a cross sectional view of the gallium nitride system semiconductor laser chip 450 according to the fourth example. The lamination layer 402 includes an n-type GaN contact layer 502, an n-type AlGaN clad layer 503, an n-type GaN guide layer 504, an InGaN multiple quantum well active layer 505, a p-type AlGaN evaporation protecting layer 506, a p-type GaN guide layer 507, a p-type AlGaN clad layer 508 and a p-type GaN contact layer 509 formed in this order on the upper face of the n-type GaN substrate 401, and further an insulating film 510 made of $SiO_2$.

The p-type AlGaN clad layer 508 and the p-type GaN contact layer 509 are provided with a stripe-like ridge 406 extending in the direction of a resonator. In other words, the gallium nitride system semiconductor laser chip 450 shown in FIG. 10 has a ridge stripe structure. Furthermore, the insulating film 510 made of $SiO_2$ is provided for current constriction between the p-side electrode 403 and the p-type AlGaN clad layer 508 as well as the p-type GaN contact layer 509 except for the ridge 406.

The material of the gallium nitride system semiconductor layer in the lamination layer 402 is not limited to the above-mentioned material. Other gallium nitride system semiconductor, for example, p-type AlGaInN may be used for the p-type clad layer, and GaInNAs, GaInP or the like may be used for the multiple quantum well active layer. In addition, the n-type AlGaN clad layer 503 or the p-type AlGaN clad layer 508 may have a multilayer structure or a multiple quantum well structure. Furthermore, an anti-cracking layer such as an InGaN layer may be inserted between the n-type GaN contact layer 502 and the n-type AlGaN clad layer 503. In addition, a buffer layer may be inserted between the n-type GaN substrate 401 and the n-type GaN contact layer 502. In addition, the stripe-like ridge 406 extending in the resonator direction may be formed by digging not only the p-type AlGaN clad layer 508 and the p-type GaN contact layer 509 but also the p-type GaN guide layer 507 and further the p-type AlGaN evaporation protecting layer 506 and further the InGaN multiple quantum well active layer 505.

Furthermore, the n-type GaN substrate 401 is used for manufacturing the gallium nitride system semiconductor laser chip 450 in the fourth example. However, the material of the substrate is not limited to GaN, but may be a semiconductor of InN, AlN or a mixed crystal of them. Further, it may be sapphire, spinel, SiC, Si or a semiconductor in the group III-V such as GaAs or GaP other than the gallium nitride system semiconductor.

(Manufacturing Process of the Gallium Nitride System Semiconductor Laser Chip)

Next, a manufacturing process of a laser device according to the fourth example will be described. First off, using a well-known technique that is generally used for producing a gallium nitride system semiconductor laser chip, a wafer is made, which includes the n-type GaN substrate 401 on which the lamination layer 402 made up of a plurality of gallium nitride system semiconductor layers or the like and the p-side electrode 403 are formed as shown in FIG. 10. The p-side electrode 403 includes a Pd layer (having a thickness of 15 nm), a Mo layer (having a thickness of 15 nm) and an Au layer (having a thickness of 200 nm) formed in this order from the p-type GaN contact layer 509 side.

Next, the back side of the n-type GaN substrate 401 is ground or etched so that a thickness of the wafer is decreased to approximately 40-150 µm from the original thickness of 350 µm. After that, a Ti layer (30 nm) and an Al layer (150 nm) are formed from the n-type GaN substrate 401 side for the n-side electrode (the inner layer) 404A. In addition, an Mo layer (8 nm), a Pt layer (15 nm) and an Au layer (250 nm) are formed for the n-side electrode (the outer layer) 404B.

In this way, the lamination layer 402, the p-side electrode 403, the n-side electrode (the inner layer) 404A and the n-side electrode (the outer layer) 404B are formed on the wafer, and this wafer is cleaved. An end face coating made of a transparent dielectric such as $Al_2O_3$ (not shown) is formed on the cleavage plane by a vacuum evaporation method or an ECR sputtering method so that the light emitting end face of the gallium nitride system semiconductor laser chip 450 is formed. In this case, the cleavage of the wafer is performed so that the oscillator length of the gallium nitride system semiconductor laser chip 450 becomes 600 μm. It is possible to form the light emitting end face by etching instead of the cleavage of the wafer.

(Chip Dividing Step of the Gallium Nitride System Semiconductor Laser Chip)

In this way, laser bars are obtained by the cleavage of the wafer, and the laser bar is further divided into gallium nitride system semiconductor laser chips 450. The chip dividing step is the same as that described previously with reference to FIGS. 4A and 4B. The gallium nitride system semiconductor laser chips 450 obtained by the chip dividing step are tested by a characteristics evaluation test in which the chip is driven by pulse current. If a threshold current value thereof is smaller than a predetermined value, the chip is selected as a good chip.

(Mounting Step of the Gallium Nitride System Semiconductor Laser Chip)

The gallium nitride system semiconductor laser chip 450 obtained by the above-mentioned method is fixed to (mounted on) the block portion 421 of the stem. Hereinafter, a mounting step will be described, in which a solder is used for fixing as a die bonding method.

Figure 11A:
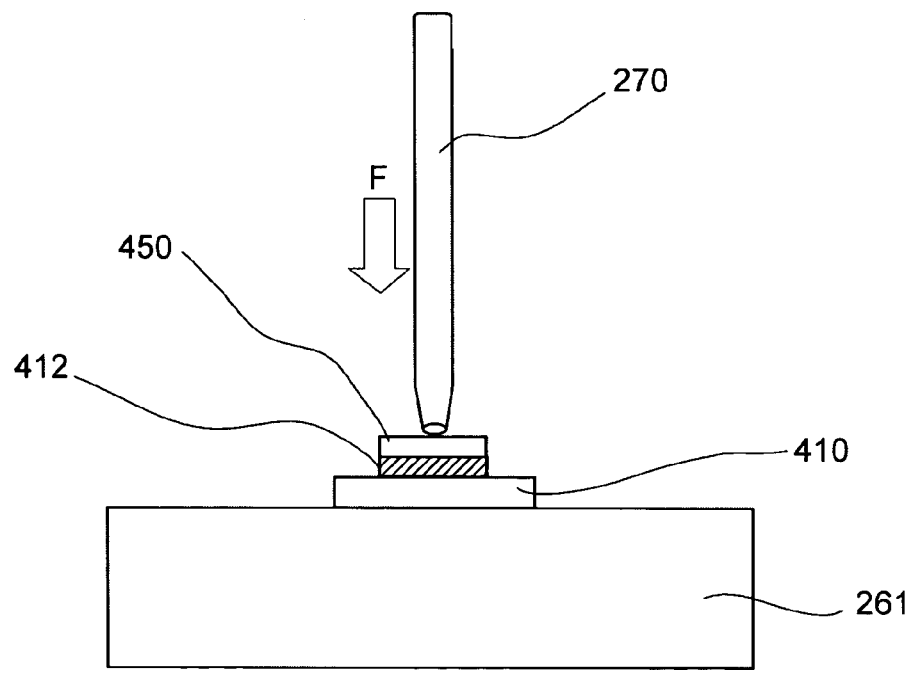
FIG. 11A is a schematic diagram showing a first half of a mounting step according to the fourth example.

As shown in FIG. 11A, the sub mount 410 is put on a support portion 261 in the mounting device filled with nitrogen. A sheet-like solder (layer) 412 having a thickness of about 200 μm and containing Au having a melting point of 280° C. at 70% and Sn at 30% by weight is put on the surface of the sub mount 410. Next, the sub mount 410 is heated to a temperature that is a little higher than a melting point of the solder 412. When the solder 412 is melted, the above-mentioned gallium nitride system semiconductor laser chip 450 is sucked by a collet 270 and placed so that the n-side electrode (the outer layer) 404B side contacts the solder 412. Further, a weight F is applied appropriately so that the gallium nitride system semiconductor laser chip 450 and the sub mount 410 conform to the solder 412 well. Then, they are cooled so that the solder 412 is hardened. Thus, the gallium nitride system semiconductor laser chip 450 is fixed to the sub mount 410.

Figure 11B:
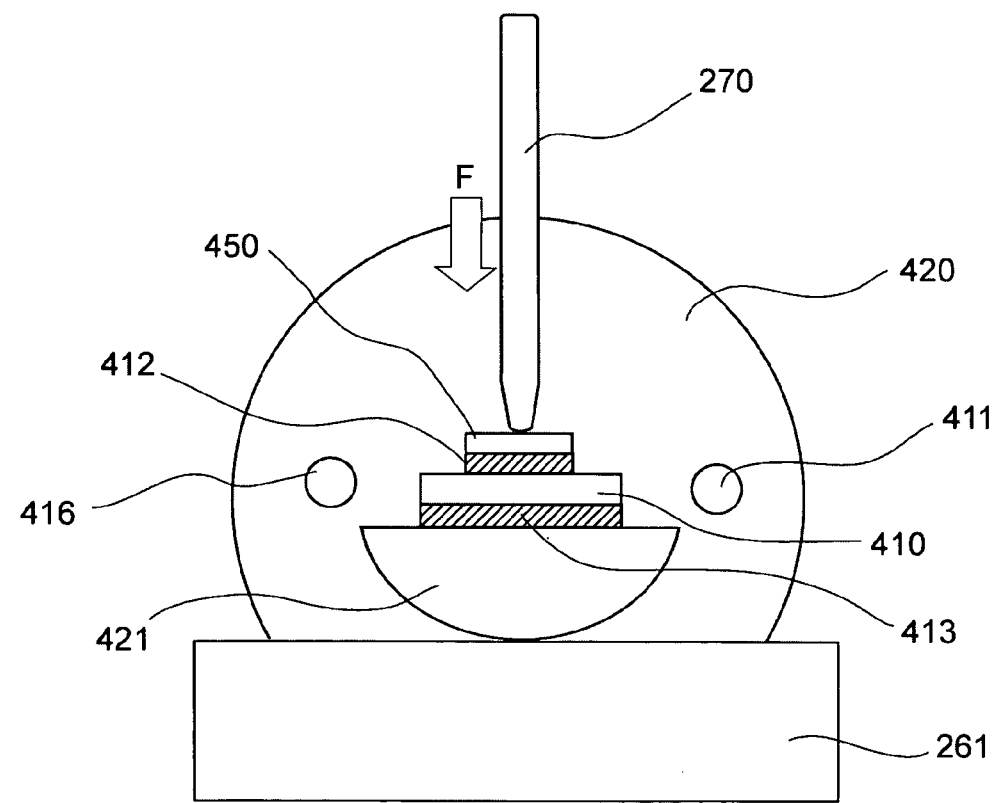
FIG. 11B is a schematic diagram showing a second half of the mounting step according to the fourth example.

Next, as shown in FIG. 11B, the stem 420 is set to the support portion 261 in the mounting device, and a solder (layer) 413 containing SnAg having a melting point of 220° C. at 3% by weight and Cu at 0.5% by weight is put on the block portion 421 of the stem. Then, the block portion 421 of the stem is heated to a temperature that is a little higher than a melting point of the solder 413. When the solder 413 is melted, the above-mentioned sub mount 410 to which the gallium nitride system semiconductor laser chip 450 is fixed is sucked by the collet 270 so that the metal multilayer film 408 side that is formed on the back side thereof faces the block portion 421 side, and it is placed on the block portion 421 of the stem. Further, a weight F is applied appropriately so that the sub mount 410 to which the gallium nitride system semiconductor laser chip 450 is fixed and the block portion 421 of the stem conform well o the solder 413. After that, the block portion 421 of the stem is cooled down so that the solder 413 is hardened, so as to obtain the gallium nitride system semiconductor laser chip 450 that is fixed to the block portion 421 of the stem via the sub mount 410.

The gallium nitride system semiconductor laser chip 450 is once taken out of the mounting device to atmosphere and is set to the wire bonding device (not shown) that is filled with nitrogen. As shown in FIG. 9A, the p-side electrode 403 and the pin 416 are connected electrically to each other via the wire 414A, while the n-side electrode (the inner layer) 404A and the pin 411 are connected electrically to each other via the n-side electrode (the outer layer) 404B, the solder 412, the metal multilayer film 407 and the wire 414B.

Although a Pd/Mo/Au multilayer film is used for the p-side electrode 403 in the fourth example, a metal selected from a group consisting of Co, Cu, Ag, Ir, Sc, Au, Cr, Mo, La, W, Al, Tl, Y, La, Ce, Pr, Nd, Sm, Eu, Tb, Ti, Zr, Hf, V, Nb, Ta, Pt and Ni or a compound thereof may be used instead of Pd, for example. Furthermore, instead of Au, a metal selected from a group consisting of Ni, Ag, Ga, Sn, Pb, Sb, Zn, Si, Ge and Al or a compound thereof may be used. The thickness of each layer is not limited to the above-mentioned value. In addition, although a Ti/Al multilayer film is used for the n-side electrode (the inner layer) 404A in the fourth example, Hf may be used instead of Ti. The thickness of each layer is not limited to the value mentioned in the fourth example.

In addition, although SiC is used as a material of the sub mount 410 in the fourth example, other material having good thermal conductivity such as AlN, GaAs, Si or diamond may be used instead.

In addition, the solder disposed on the surface of the sub mount 410 (on the metal multilayer film 407 side) is not limited to the composition containing Au at 70% and Sn at 30%. It can be the composition containing Au at 80% by weight and Sn at 20% by weight, which is a eutectic point. It is possible to use other solder material such as SnAgCu, In or PbSn, for example. Furthermore, the ratio of Au to Sn in the AuSn solder is not restrictive, too. In addition, the solder material between the back side of the sub mount 410 (the metal multilayer film 408 side) and the block portion 421 of the stem is not limited to $SnAg_3Cu_{0.5}$. Any of AuSn, In, PbSn, Ag paste or other conductive paste can be used. In addition, it is possible to change the ratio among Sn, Ag and Cu in the solder containing SnAg at 3% and Cu at 0.5%, and the ratio is not restrictive. Note that it is sufficient that a melting point of the solder disposed on the surface of the sub mount 410 (the metal multilayer film 407 side) is higher than or equal to a melting point of the solder disposed between the back side of the sub mount 410 (the metal multilayer film 408 side) and the block portion 421 of the stem. If the two melting points are equal to each other, the die bonding of the both sides can be performed at the same time.

In addition, the stem 420 having the block portion 421 is made of a metal containing Cu or Fe as a main component, and on the surface thereof an Ni film and an Au film, or an Ni film, a Cu film and an Au film are formed in this order by the plating method.

(Hermetical Sealing Step)

Figure 12:
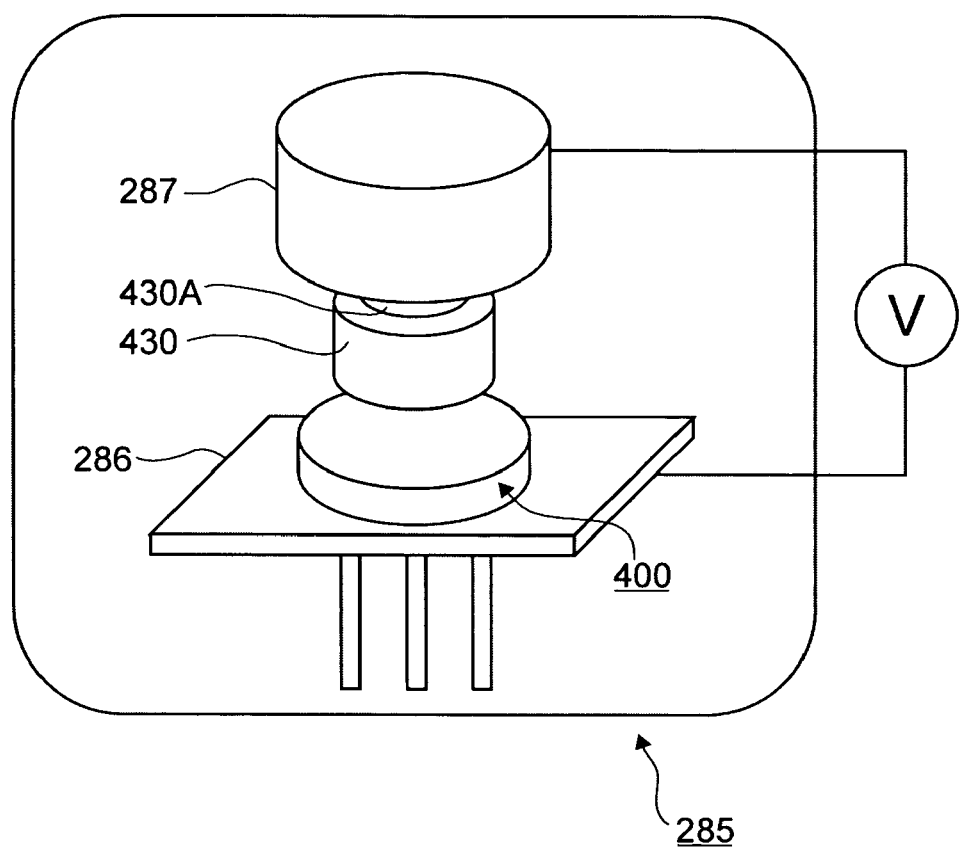
FIG. 12 is a schematic diagram showing a hermetical sealing step according to the fourth example.

Next, the laser chip fixing holder 400 is put on a base 286 of a hermetical sealing device 285 that is filled with dry air having a dew point of −20° C. in the hermetical sealing device 285 as shown in FIG. 12. The cap 430 is held by a tool 287 and is put on the laser chip fixing holder 400. Current is supplied between the base 286 and the tool 287 by the resistance heating method, so that the laser chip fixing holder 400 and the cap 430 are welded to each other to be sealed hermetically. Thus, the semiconductor laser device 440 is manufactured. In this way, the inside of the package of the gallium nitride system semiconductor laser chip 450 is shut off from the external atmosphere.

Note that the filler gas in the package is not limited to dry air, but can be an inert gas such as dry nitrogen, helium, neon, argon, krypton or the like or a mixed gas of dry inert gas and dry air or oxygen.

(Ultraviolet Ray Irradiating Step)

Figure 13:
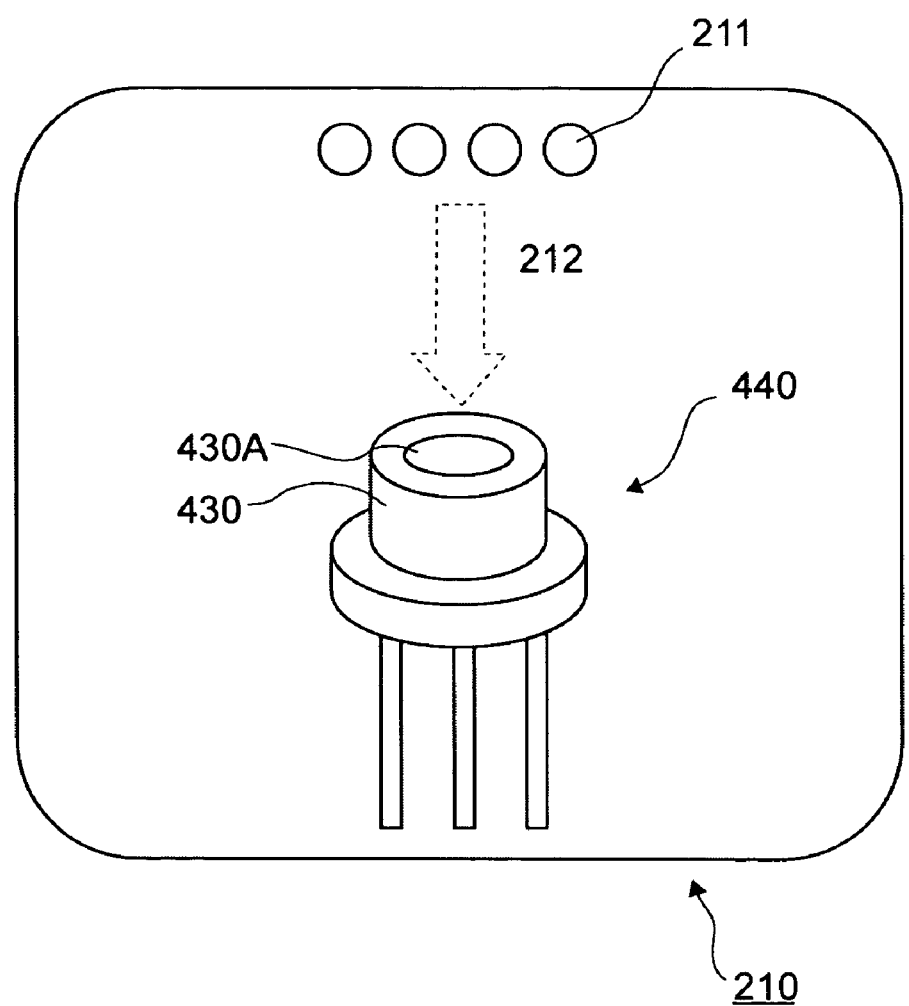
FIG. 13 is a schematic diagram showing an ultraviolet ray irradiating step according to the fourth example.

Next, the semiconductor laser device 440 is put in an ultraviolet ray irradiation device 210 shown in FIG. 13 and is heated to 200° C. by a heater (not shown). The ultraviolet ray irradiation device 210 is equipped with a mercury lamp 211 that emits ultraviolet rays having a wavelength of 185 nm and a wavelength of 254 rm. Through the light transparent window 430A of the cap 430 of the semiconductor laser device 440, the ultraviolet ray 212 is irradiated from the mercury lamp 211 to the inside of the semiconductor laser device 440 for 10 minutes. Illuminance of the mercury lamp 211 is set to 5 mW/cm$^2$. In order to perform this step efficiently, it is preferable that the light transparent window 430A is made of a material that can pass the above-mentioned ultraviolet ray well, in particular quartz or quartz glass. In this case, it can pass light having a wavelength of 150 nm or longer.

In the case of a siloxane system material that is a candidate of the contaminant, the center wavelength of light absorption of a siloxane bond (Si—O) that forms a framework thereof is approximately 270 nm. Therefore, when light having a wavelength of 290 nm or shorter is irradiated, the siloxane bond becomes an excited state so that photolysis thereof is promoted. Light from the mercury lamp 211 (having a wavelength of 185 nm and a wavelength of 254 nm) is light having a wavelength shorter than 290 nm, so it can promote photolysis. In addition, even if light having a wavelength longer than 290 nm is irradiated, a bond between Si and a side chain (Si—C or the like) in the siloxane system material becomes an excited state so that photolysis thereof is promoted. When the siloxane system material is decomposed, a substance containing solid silicon oxide as a main component is generated as a photochemical reaction substance, which is considered to become a main component of a contaminant.

In the case of an organic substance having a carbon bond that is another candidate of the contaminant, a C—C bond that forms a framework thereof is promoted to be decomposed by light having a wavelength within the range of 290-420 nm. On the contrary, if the organic substance having a carbon bond becomes to have a molecular weight larger than that of the original organic substances by a photochemical reaction through polymerization or crosslinkage, the photochemical reaction substance becomes a solid residue. Such an organic substance having the carbon bond is considered to become a contaminant.

As described above, the light source is not limited to the mercury lamp 211. It can be any of a halogen lamp, an ultraviolet ray laser, an ultraviolet ray LED and an excimer lamp as long as it has a wavelength of 420 nm or shorter. In addition, the illuminance and the time period are not limited to the above-mentioned values. Note that the deposition of the photochemical reaction substance on the light emitting end face occurs in a laser device that uses the gallium nitride system semiconductor laser chip having an oscillation wavelength of 420 nm or shorter. From this fact it is concluded to be effective to use the light having a wavelength of 420 nm or shorter (such as an ultraviolet ray) in the ultraviolet ray irradiating step of the manufacturing method according to this example.

As described above, when the ultraviolet ray 212 is irradiated into the semiconductor laser device 440, the vaporized contaminant is decomposed by heat. The light emitting end face is also exposed to the ultraviolet ray. However, the area to be irradiated with the ultraviolet ray is the entire space sealed hermetically, and it is much larger than the light emitting end face. Therefore, the deposition of the photochemical reaction substance on the light emitting end face can be neglected in this ultraviolet ray irradiating step. As a result, the deposition of the photochemical reaction substance on the light emitting end face is prevented while the element is operating. Thus, it is possible to realize the element having a long life with little degradation of characteristics such as increasing drive current during operation.

Since the ultraviolet ray irradiating step is performed while heating, the contaminant is vaporized easily so that the effect of the irradiation of the ultraviolet ray can be promoted. Boiling points of typical siloxane system materials that are candidates of the contaminant are as follows. A boiling point of 1,1,3,3-tetramethyldisiloxane is 70° C. A boiling point of pentamethyl disiloxane is 86° C. A boiling point of hexamethyl disiloxane is 101° C. A boiling point of octamethyl trisiloxane is 153° C. A boiling point of hexamethyl cyclotrisiloxane is 188° C. A boiling point of octamethyl cyclotetrasiloxane is 175° C. A boiling point of decamethyl cyclopentasiloxane is 211° C. A boiling point of dodecamethylcyclo hexasiloxane is 245° C.

In addition, boiling points of typical organic substances having a carbon bond that are candidates of the contaminant are as follows. A boiling point of benzene is 80° C. A boiling point of methyl ethyl ketone is 80° C. A boiling point of toluene is 110° C. A boiling point of butanol is 117° C. A boiling point of xylene is 140° C. A boiling point of decane is 174° C. A boiling point of butyl acetate is 100-150° C. A boiling point of dodecane is 213° C. A boiling point of tetradecane is 254° C. A boiling point of cyclohexylacetate is 177° C. A boiling point of 2-ethylhexylacetate is 199° C. A boiling point of phosphoric ester is 215° C.

Such a contaminant is considered to be generated from a human body, a microorganism, a construction material, grease or oil or the like that is used for manufacturing devices, or an adhesive agent that is contained in the pressure sensitive adhesive sheet. In addition, a contaminant may be generated when a substance having a larger molecular weight than the above-mentioned substances is decomposed. The vaporized contaminant can be removed effectively by heating the substance to its boiling point and by irradiating an ultraviolet ray or the like. Therefore, in order to remove a siloxane system material for example, heating temperature is preferably 70° C. or higher, more preferably 101° C. or higher and much more preferably 153° C. or higher. If it is 70° C. or higher, an organic substance having a carbon bond such as benzene can also be removed effectively.

In addition, when a dew point of the filler gas is set to −10° C. or lower, it is possible to prevent attachment of moisture to the element. If moisture attaches to the element, corrosion of electrodes and absorption of moisture (humidity) into the insulating film and a coating film of the end face may occur, so that deterioration of the element may occur during operation of the element.

(Aging Test)

A total of five semiconductor laser devices 440 that oscillates at a light emission wavelength of 405 nm was manufactured by the steps described above, and an aging test was performed for them so as to check long term stability of drive current. The aging test was performed under a condition of ambient temperature at 60° C. and a drive condition of light power at 30 mW with the automatic power control (APC) of direct current (DC).

Figure 14:
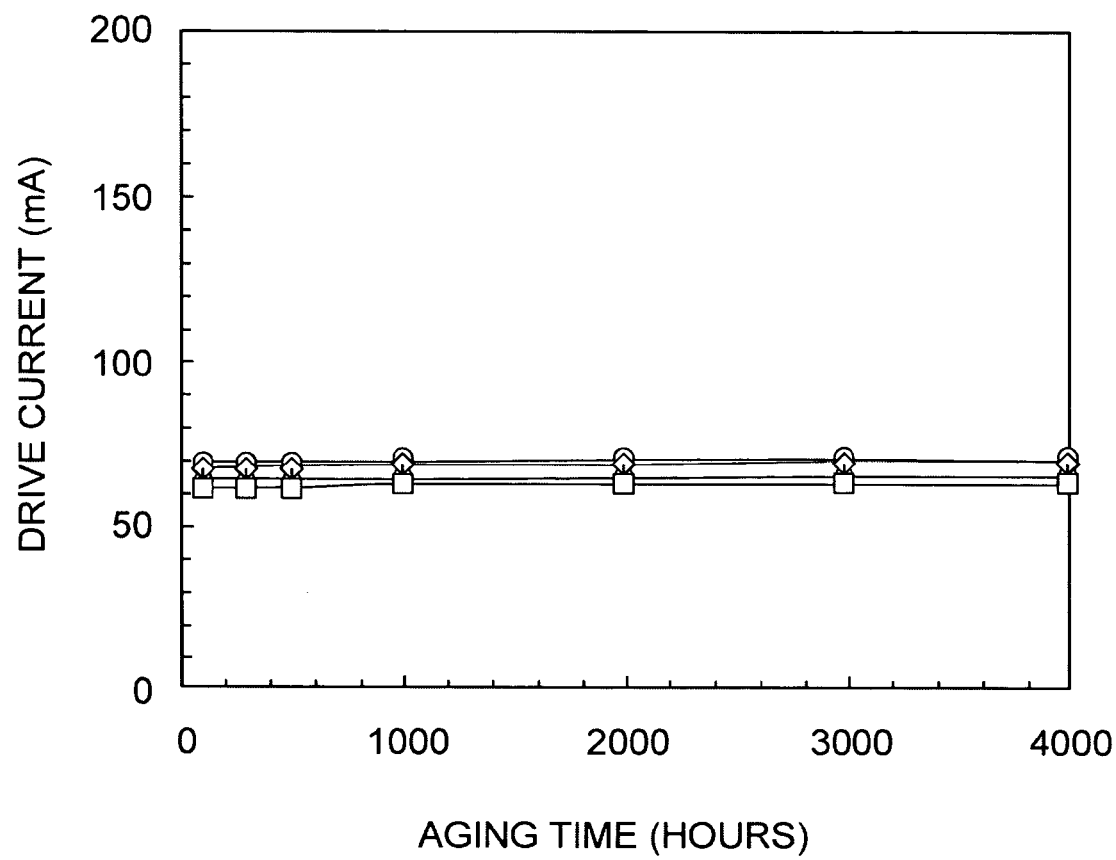
FIG. 14 is a graph showing a test result of the semiconductor laser device obtained by the manufacturing method according to the fourth example.

FIG. 14 is a graph showing a test result of the semiconductor laser devices obtained by the manufacturing method according to the fourth example. FIG. 14 shows a relationship between an aging time and drive current for five semiconductor laser devices 440 obtained by the manufacturing method of the fourth example. As shown in FIG. 14, the semiconductor laser devices 440 processed in the ultraviolet ray irradiating step at 200° C. keep its drive current of substantially the same value as the initial current value after 4,000 hours of aging. In addition, a variation of drive current among the five semiconductor laser devices 440 is as small as approximately 10 mA both in the initial value and after the long term aging test.

Fifth Example

In a manufacturing method of a fifth example, temperature in the ultraviolet ray irradiating step is set to 70° C. Other conditions are the same as in the fourth example. However, temperature increase due to the lighting mercury lamp 211 is utilized instead of the heater for increasing the temperature to 70° C.

A total of five semiconductor laser devices were manufactured by the manufacturing method of the fifth example, and the aging test was performed for them in the same manner as the semiconductor laser device 440 in the fourth example for checking long term stability of drive current. The aging test was performed under a condition of ambient temperature at 60° C. and a drive condition of light power at 30 mW with the automatic power control (APC) of direct current (DC).

Figure 15:
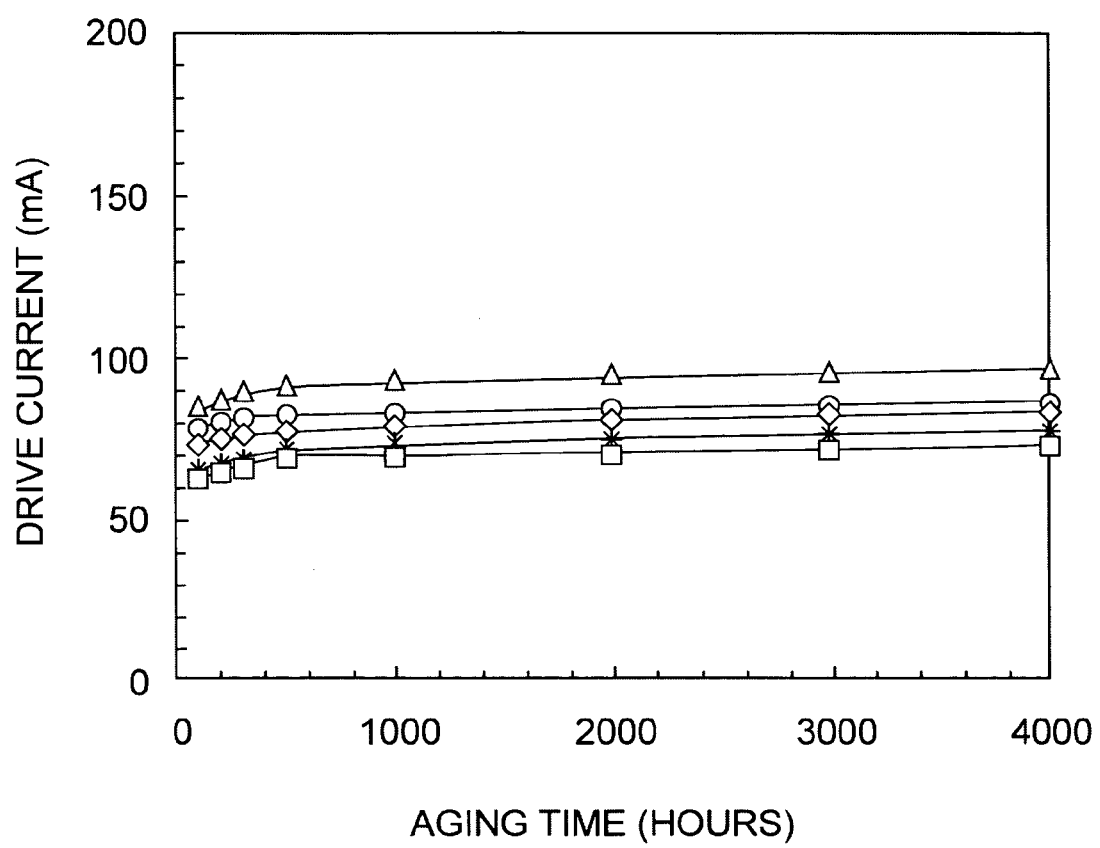
FIG. 15 is a graph showing a test result of the semiconductor laser device obtained by a manufacturing method according to a fifth example.

FIG. 15 is a graph showing a test result of the semiconductor laser devices obtained by a manufacturing method according to the fifth example. FIG. 15 shows a relationship between an aging time and drive current for five semiconductor laser devices obtained by the manufacturing method of the fifth example. The semiconductor laser devices obtained by the manufacturing method of the fifth example in which the ultraviolet ray irradiating step was performed at a room temperature had a little increase of drive current along with the aging time. However, if the life is defined as the time when the drive current becomes 1.4 times the initial current value, a life longer than 4,000 hours that is the test time is obtained.

First Comparison Example

As a first comparison example of the fourth example, the semiconductor laser device 440 was manufactured without the ultraviolet ray irradiating step. Other conditions were the same as in the fourth example. A total of five semiconductor laser devices 440 were manufactured by the manufacturing method of the first comparison example, and the aging test was performed for them so as to check long term stability of drive current in the same manner as the semiconductor laser device 440 in the fourth example. The aging test was performed under a condition of ambient temperature at 60° C. and a drive condition of light power at 30 mW with the automatic power control (APC) of direct current (DC).

Figure 16:
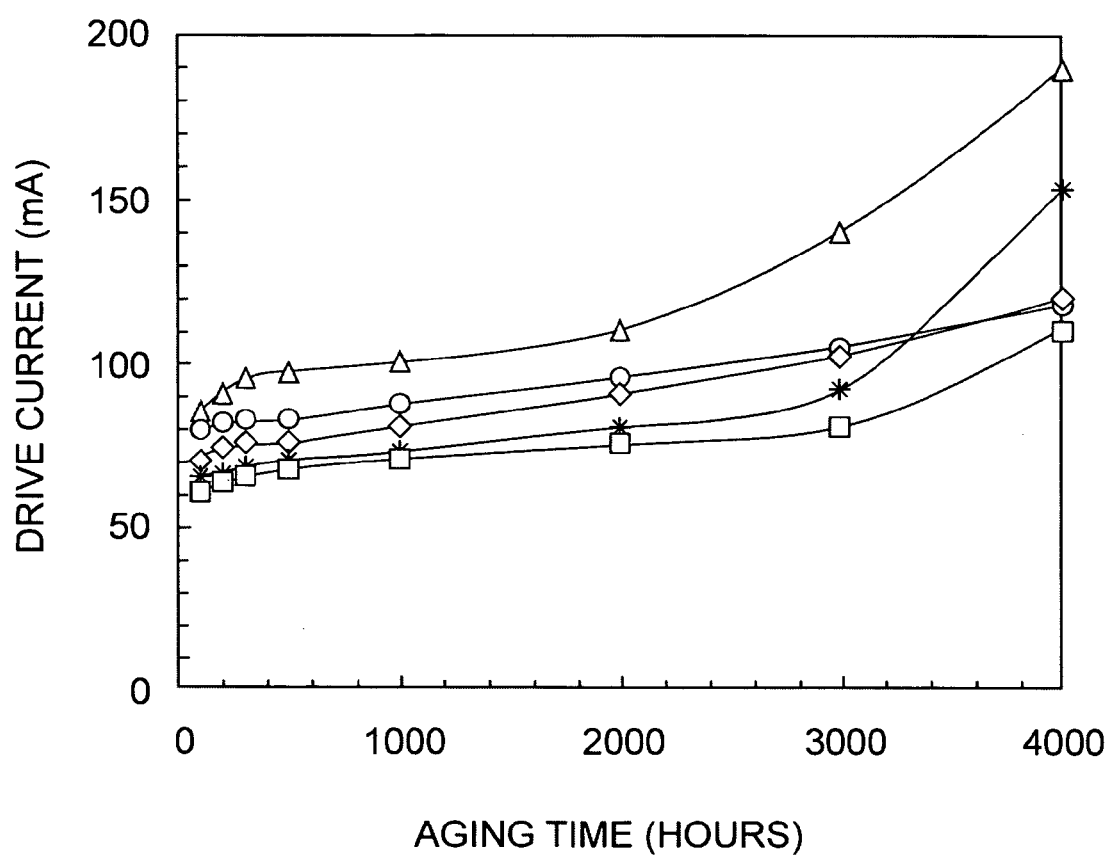
FIG. 16 is a graph showing a test result of the semiconductor laser device obtained by a manufacturing method according to a first comparison example.

A test result of the semiconductor laser devices obtained by the manufacturing method of the first comparison example is shown in FIG. 16. FIG. 16 shows a relationship between an aging time and drive current for five semiconductor laser devices obtained by the manufacturing method of the first comparison example. The semiconductor laser device of the first comparison example in which the ultraviolet ray irradiating step was not performed has a conspicuous increase of drive current as the aging time becomes longer. In addition, it is understood that a variation of the drive current among the five semiconductor laser devices is large.

Second Comparison Example

As a second comparison example of the fourth example, the semiconductor laser device 440 was manufactured under the condition that a dew point of the filler gas is 0° C. Other conditions are the same as in the fourth example. A total of five semiconductor laser devices were manufactured by the manufacturing method of the second comparison example, and the aging test was performed for them so as to check long term stability of drive current in the same manner as the semiconductor laser device 440 in the fourth example. The aging test was performed under a condition of ambient temperature at 60° C. and a drive condition of light power at 30 mW with the automatic power control (APC) of direct current (DC).

Figure 17:
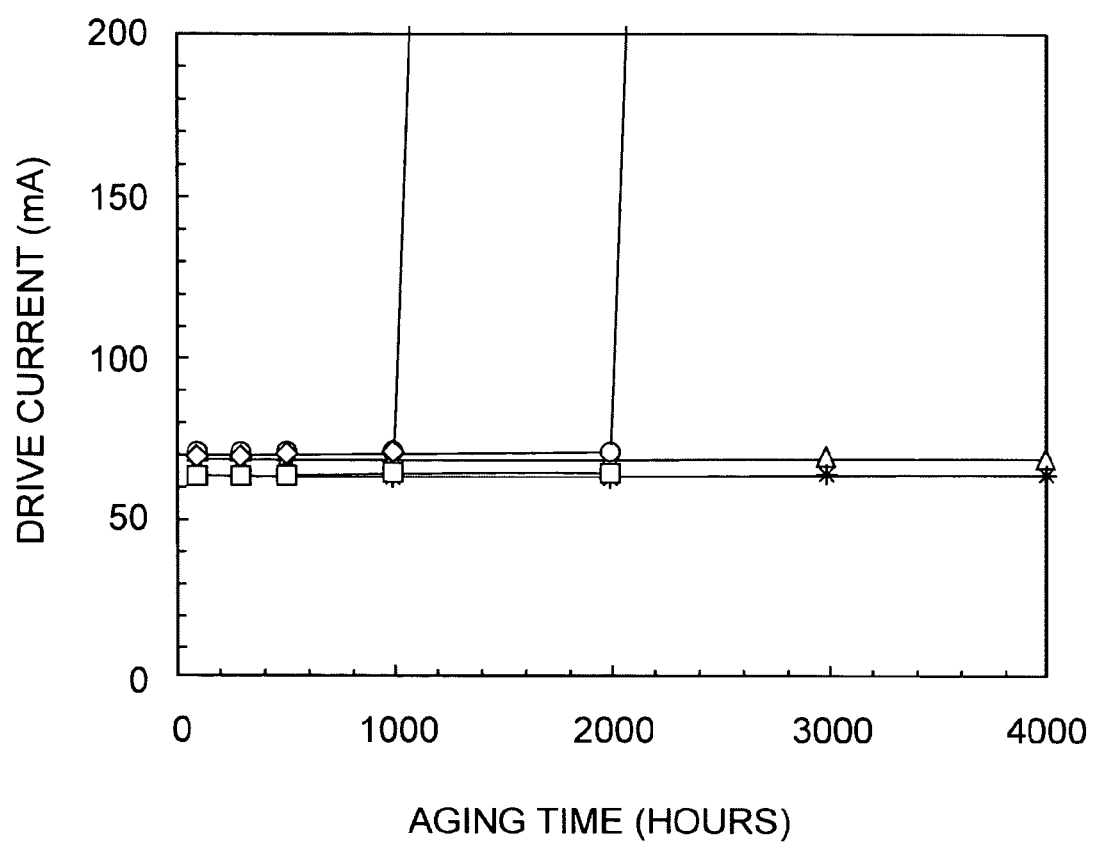
FIG. 17 is a graph showing a test result of the semiconductor laser device obtained by a manufacturing method according to a second comparison example.

A test result of the semiconductor laser device obtained by the manufacturing method of the second comparison example is shown in FIG. 17. FIG. 17 shows a relationship between an aging time and drive current for five semiconductor laser devices obtained by the manufacturing method of the second comparison example. Three out of five semiconductor laser devices became out of order during the aging test. It was found that a cause of the failure was corrosion of electrodes. In this way, the state of failure of the semiconductor laser device obtained by the manufacturing method of the second comparison example is caused by corrosion of electrodes, which is different from the degradation found in the first comparison example.

(Factor of Characteristic Difference)

In order to study factors of difference in characteristics among semiconductor laser devices obtained by manufacturing methods of the fourth example, the fifth example and the first comparison example, substances deposited on the light emitting end face were analyzed by using an Auger electron spectral method for semiconductor laser devices obtained by the manufacturing methods of the fourth example, the fifth example and the first comparison example. From the light emitting end face of the semiconductor laser device in the first comparison example, there was detected carbon indicating deposition of organic substances having a concentration of ten times the semiconductor laser device in the fourth example and silicon indicating deposition of silicon compound. From the light emitting end face of the semiconductor laser device in the fifth example, there was detected carbon and silicon of approximately twice the semiconductor laser device in the fourth example. From the result described above, it is considered that the reason why the semiconductor laser device in the first comparison example did not have a good long term stability of drive current was that a photochemical reaction substance containing carbon or silicon is deposited on the light emitting end face of the gallium nitride system semiconductor laser chip 450, thereby an increase of light absorption and a fluctuation of reflectance had occurred so that degradation of characteristics such as increase of drive current was generated.

OTHER EXAMPLES

Although a can type package made up of the stem 420 and the cap 430 is used in the fourth and the fifth examples described above, it is possible to use a carrier type package instead of the can type package, for example. In addition, it is possible to fix a semiconductor element other than the gallium nitride system semiconductor laser chip 450, e.g., a light receiving element to the stem 420.

Although the light transparent window 430A is provided to the cap 430 in the fourth and the fifth examples described above, the light transparent window may be provided to any part of the package as long as it can pass light emitted by the laser chip and light from outside having a wavelength of 420 nm or shorter. For example, it can be provided to the stem.

In addition, the method for manufacturing a laser device according to the present invention can also be applied to a semiconductor device other than the laser device using the gallium nitride system semiconductor laser chip, such as a laser coupler or an optical pickup device.

The examples of the present invention described above should not be considered to be restrictive in all respects. The scope of the present invention is defined not by the above description but by the claims, which includes possible modifications within the scope of the claims and equivalent thereof.

What is claimed is:

1. A method for manufacturing a laser device, comprising the steps of:
    fixing a laser chip to a holder via a metal having a low melting point by melting the metal at a temperature higher than the melting point;
    heating the holder to which the laser chip is fixed and a cap at a heat treatment temperature that is lower than the melting point; and
    sealing the laser chip after the heating step by covering the holder to which the laser chip is fixed with the cap.

2. The method according to claim 1,
    wherein the heating step is performed in an atmosphere in which ozone is generated.

3. The method according to claim 1,
    wherein the heating step is performed in an atmosphere in which oxygen plasma is generated.

4. The method according to claim 1,
    wherein the heating step is performed at the heat treatment temperature that is lower than the melting point by 20° C. or more.

5. The method according to claim 1,
    wherein the heating step is performed for 10 minutes or longer.

6. The method according to claim 1,
    wherein the metal having a low melting point is an Au—Sn alloy containing Sn more than or equal to 15% by weight and less than or equal to 90% by weight, and the heating step is performed at the heat treatment temperature of 175° C. or higher.

7. The method according to claim 2,
    wherein the heating step that is performed in the atmosphere in which ozone is generated includes preventing the laser chip from being irradiated directly with an ultraviolet ray for generating ozone.

8. The method according to claim 1,
    wherein the heating step is performed in an atmosphere filled with a gas selected from a group consisting of nitrogen, hydrogen, helium and xenon, or with a combination of two or more gases selected from said group.

9. The method according to claim 1,
    wherein the sealing step includes hermetical sealing of the laser chip after filling a filler gas having a dew point of −10° C. or lower.

10. The method according to claim 1,
    wherein the heating step includes heating the holder to which the laser chip is fixed and the cap in an atmosphere having a dew point of −10° C. or lower.

11. The method according to claim 1,
    wherein the scaling step includes hermetical sealing of the laser chip after filling a gas selected from a group consisting of dry air, nitrogen, oxygen, hydrogen, argon, helium and xenon, or filling a combination of two or more gases selected from said group.

12. The method according to claim 1,
    wherein a time period of 60 minutes or shorter for exposing the holder to which the laser chip is fixed to atmosphere is provided between the heating step and the sealing step.

13. The method according to claim 1,
    wherein the laser chip has a light emission wavelength of 500 nm or shorter.

14. The method according to claim 1,
    wherein the laser chip is a nitride semiconductor laser chip.

* * * * *